United States Patent [19]
Suzuki et al.

[11] Patent Number: 5,336,638
[45] Date of Patent: Aug. 9, 1994

[54] PROCESS FOR MANUFACTURING SEMICONDUCTOR DEVICES

[75] Inventors: Masayuki Suzuki; Ryo Haruta, both of Kokubunji; Hiroshi Shinriki, Tokyo; Masayuki Nakata, Kokubunji, all of Japan

[73] Assignee: Hitachi, Ltd., Tokyo, Japan

[21] Appl. No.: 846,828

[22] Filed: Mar. 6, 1992

[30] Foreign Application Priority Data

Mar. 6, 1991 [JP] Japan ............................. 3-38837
Dec. 6, 1991 [JP] Japan ............................ 3-322735

[51] Int. Cl.$^5$ .................................................. H01L 21/44
[52] U.S. Cl. ........................................ 437/190; 437/52; 437/60; 437/235; 437/919; 148/DIG. 117
[58] Field of Search ............... 437/190, 919, 52, 60, 437/235, 246, 195; 148/DIG. 109, DIG. 81, DIG. 117

[56] References Cited

U.S. PATENT DOCUMENTS

| | | | |
|---|---|---|---|
| 4,437,139 | 3/1984 | Howard | 437/919 |
| 4,495,219 | 1/1985 | Kato et al. | 437/919 |
| 4,891,684 | 1/1990 | Nishioka et al. | 437/919 |
| 4,962,414 | 10/1990 | Liou et al. | 437/193 |
| 4,999,155 | 3/1991 | Ong et al. | 148/DIG. 117 |
| 5,035,957 | 7/1991 | Bartlett et al. | 148/DIG. 117 |
| 5,070,379 | 12/1991 | Nomoto et al. | 437/189 |
| 5,079,191 | 1/1992 | Shinriki et al. | 437/919 |
| 5,126,283 | 6/1992 | Pintchovski et al. | 437/197 |
| 5,142,438 | 8/1992 | Reinberg et al. | 437/52 |

FOREIGN PATENT DOCUMENTS

| | | | |
|---|---|---|---|
| 0029340 | 3/1981 | Japan | 437/235 |
| 61-101069 | 5/1986 | Japan | 437/247 |
| 63-312664 | 12/1988 | Japan | 437/919 |
| 2-151060 | 6/1990 | Japan | 437/919 |

OTHER PUBLICATIONS

Oehrlein et al.; "Electrical properties of amorphous tantalum pentoxide thin films on silicon"; pp. 6502–6508 of American Institute of Physics; Journal of Applied Physics 54(11); Nov. 1983.

Kawamoto et al.; "A 1.28 μm$^2$ Bit–Line Shielded Mem. Cell Technology for 64 Mb Drams"; pp. 13–14 of IEEE; Symposium on VLSI Tech.; 1990.

Nishioka et al.; "Application of high dielectric constant insulation film Ta$_2$O$_5$ to VSLIs"; pp. 1622–1628 of App. Phys. Association of Applied Physics 58(11); Aug. 1989.

Primary Examiner—Tom Thomas
Assistant Examiner—Michael Trinh
Attorney, Agent, or Firm—Antonelli, Terry, Stout & Kraus

[57] ABSTRACT

Herein disclosed is a process for manufacturing a semiconductor device, which comprises: a step of forming a first electrode composed of tantalum and tungsten over a semiconductor substrate; a step of depositing a dielectric film of tantalum oxide on the first electrode; a step of oxidizing the first electrode and the dielectric film of tantalum oxide; and a step of forming a second electrode over the dielectric film.

29 Claims, 13 Drawing Sheets

5,336,638

PROCESS FOR MANUFACTURING SEMICONDUCTOR DEVICES

BACKGROUND OF THE INVENTION

The present invention relates to a semiconductor device and, more particularly, to a technology which is effective if applied to a semiconductor device having a capacitor element.

In a semiconductor device, especially a semiconductor device including a memory cell of DRAM (Dynamic Random Access Memory) having a selecting MISFET and a capacitor element connected in series, the size of the memory cell has been reduced to improve the degree of integration. Accordingly, the size of the capacitor element is also reduced. In order to keep a reliability to soft errors due to alpha rays, however, the amount of charge to be stored by the capacitor element cannot be decreased less than a predetermined value. Thus, a capacitor element of stacked structure is used to reduce the size of the memory cell and to improve the reliability to the soft errors.

The capacitor element is composed of a lower electrode and an upper electrode formed over the lower electrode through a charge storing insulating film. The lower electrode is formed of a polycrystalline silicon film. The lower electrode is connected with the source or drain region of the selecting MISFET. The charge storing insulating film is formed of a silicon oxide film which is prepared by thermally oxidizing the polycrystalline silicon film forming the lower electrode. Alternatively, the charge storing insulating film is formed of a laminated film which is composed of a silicon nitride film formed over the polycrystalline silicon film and a silicon oxide film formed over the silicon nitride film by thermally oxidizing the silicon nitride film. The upper electrode is formed of a polycrystalline silicon film.

In order to further reduce the size of the memory cell, however, the size of the capacitor element has to be reduced by increasing the dielectric constant of charge storing insulating film thereby to increase the amount of charge to be stored per unit area. Thus, there has been proposed a method by which the silicon oxide film and the silicon nitride film are replaced by a metal oxide film such as a tantalum oxide ($Ta_2O_5$) film having a higher dielectric constant than those of the silicon oxide film and the silicon nitride film so as to form the charge storing insulating film.

The tantalum oxide film is prepared by the CVD method, for example. The technology of this kind is disclosed, for example, on pp. 13-14 of IEEE, Symposium on VLSI Technology (1990).

On the other hand, the tantalum oxide film is prepared, for example, by forming a tantalum film by a the electron beam evaporation method or the high-frequency sputtering method and subsequently by oxidizing the tantalum film. The technology of this kind is disclosed, for example, on pp. 6502-6508 of American Institute of Physics, Journal of Applied Physics, 54(11) (1983).

According to the method of preparing the tantalum oxide film by forming the tantalum film by the electron beam evaporation method or the high-frequency sputtering method and subsequently by thermally oxidizing the tantalum film, however, this tantalum film has a rough surface, when it is formed, so that the thickness of the tantalum oxide film formed by the thermal oxidation will disperse. With this dispersion in the film thickness, the breakdown voltage of the tantalum oxide film will drop to raise a problem that the reliability of the semiconductor device degrades.

Thus, there has been proposed a method by which the tantalum oxide film formed by the reactive sputtering method is oxidized again. Thanks to this oxidation, the underlying silicon of the tantalum oxide film is thermally oxidized in the region, in which the tantalum oxide film is thin, to form the silicon oxide film. According to this method, the breakdown voltage of the portion having the thin tantalum oxide film is improved by the silicon oxide film formed by the oxidation step so that the breakdown voltage of the charge storing insulating film can be improved. As a result, the reliability of the semiconductor device can be improved. The technology of this kind is disclosed, for example, on pp. 1622 to 1628 of Applied Physics of Association of Applied physics 58, 11 (1989).

SUMMARY OF THE INVENTION

However, we have examined the prior art thus far described and have found the following problems.

In case the tantalum oxide film is formed by the CVD method, the underlying silicon (i.e., the polycrystalline silicon film) reacts with the tantalum oxide to reduce it. In order to prevent the reduction of the tantalum oxide by the silicon, the tantalum oxide film has to be formed over the silicon oxide film after this silicon oxide film has been formed over the underlying silicon. As a result, the charge storing insulating film is formed of the laminated film composed of the silicon oxide film and the tantalum oxide film.

In case, on the other hand, the tantalum oxide film is formed by the thermal oxidation after the tantalum film has been formed by the electron beam evaporation method or the high-frequency sputtering method, the silicon oxide film is formed in the interface between the tantalum oxide film and the underlying silicon at the thermal oxidation step of forming the tantalum oxide film. As a result, the charge storing insulating film is formed of the laminated film composed of the silicon oxide film and the tantalum oxide film.

According to the method by which the tantalum oxide film is formed by the reactive sputtering method and is oxidized again, the charge storing insulating film is likewise formed of the laminated film composed of the silicon oxide film and the tantalum oxide.

In case the tantalum oxide film is formed over the silicon by the CVD method, the electron beam evaporation method or the sputtering method, the charge storing insulating film is formed of the laminated film of the silicon oxide film and the tantalum oxide film. Thus, there arises a problem that the dielectric constant of the charge storing insulating film drops lower than that of the single-layer film of the tantalum oxide film.

An object of the present invention is to provide a technology capable of effecting a high integration in a process for manufacturing a semiconductor device having a capacitor element.

Another object of the present invention is to provide a technology capable of improving a reliability in the process for manufacturing the semiconductor device.

Still another object of the present invention is to provide a technology capable of forming a charge storing insulating film having a high dielectric constant in the process for manufacturing the semiconductor device.

The aforementioned and other objects and novel features of the present invention will become apparent from the description to be made with reference to the accompanying drawings.

The representatives of the invention to be disclosed herein will be briefly summarized in the following:

(1) A process for manufacturing a semiconductor device including a capacitor element having a lower electrode formed over a semiconductor substrate and an upper electrode formed over the lower electrode through a charge storing insulating film, comprises: the step of forming metal films of at least two kinds of metals having different oxidizing conditions; the step of forming a charge storing insulating film by oxidizing a first one of said at least two kinds of metals selectively to form an oxide film of said first metal on the surface of the second metal unoxidized or the surface of the metal film, and forming the lower electrode of said metal film; and the step of forming the upper electrode over said charge storing insulating film.

(2) A process for manufacturing a semiconductor device including a capacitor element having a second electrode formed over a first electrode through a charge storing insulating film, comprises: the step of forming a first electrode of a metal film composed of at least two kinds of metals having different oxidizing conditions; the step of forming the charge storing insulating film by depositing an oxide film of the first metal over the metal film; the step of oxidizing the oxide film of the first metal; and the step of forming a second electrode over said charge storing insulating film.

(3) The atmosphere for oxidizing said first metal selectively is composed of a mixture of hydrogen and steam.

(4) Said first metal is any or a combination of two or more kinds of elements of IVb or Vb groups, and said second metal is Mo, W or Mo and W.

(5) Said metal film is formed after an oxidation resisting film has been formed over said silicon film.

(6) Said oxidation resisting film is made of TiN, a Ti-W alloy, TiSim, NiSi or CoSi$_2$.

According to the foregoing means (1), (3) or (4), the oxide film of the first metal (e.g., any or a combination of two or more kinds of elements of IVb or Vb group) is selectively formed from the metal film which is composed of the first metal and the second metal (e.g., Mo, W or Mo and W). As a result, the second metal underlying the oxide film of the first metal functions as a barrier layer to prevent a reduction between the silicon composing the lower electrode and the oxide film of the first metal. Thus, the silicon oxide film need not be formed over the metal film composed of two kinds of metals so that the charge storing insulating film can be formed of the single-layer film of the oxide film of the first metal.

Since, moreover, no silicon exists in the interface between the metal film of the aforementioned two kinds of metals and the oxide film of the first metal, no silicon oxide film is formed in the interface between the oxide film of the first metal and the metal film. As a result, the charge storing insulating film can be formed of a single-layer film of the oxide film of the first metal.

In case, moreover, the first metal is selectively oxidized, its oxide separates out to the surface of the metal film composed of two kinds of metals. The oxide film of the first metal thus having separated stops its growth at a constant thickness. This phenomenon is considered as a kind of grain segregation. As a result, even if the metal film is sufficiently oxidized, only the oxide film of the first metal is selectively formed.

Since the charge storing insulating film can be thus formed of the single-layer film of the oxide film of the first metal, the dielectric constant can be made higher than that of the case, in which the charge storing insulating film is formed of either the single silicon oxide film or the laminated film of the silicon oxide film and the oxide film of the first metal. As a result, the process for manufacturing the semiconductor device can form a dielectric film having a high dielectric constant. Since, moreover, the charge storing insulating film has an increased amount of charge to be stored per unit area, the size of the capacitor element can be reduced to integrate the semiconductor device highly.

According to the foregoing means (2), furthermore, even in case the oxide film of the first metal deposited over the metal film composed of two kinds of metals has a dispersion, the first metal in the underlying metal film is oxidized selectively in a region, in which the oxide film of the first metal is thin, to form the oxide film of the first metal. Since the oxide film of the first metal in the thin region is thickened by the oxide film of the first metal formed by the oxidation, it is possible to reduce the dispersion of the thickness of the oxide film of the first metal. As a result, the breakdown voltage of the charge storing insulating film can be improved to improve the reliability of the semiconductor device.

At the step of oxidizing the metal film composed of two kinds of metals or at the step of oxidizing the oxide film of the first metal, according to the foregoing means (5) or (6), it is possible to prevent the silicon composing the lower electrode from being oxidized and to prevent the reaction between the metal film and the silicon.

DESCRIPTION OF THE PREFERRED EMBODIMENTS

Figure 1:
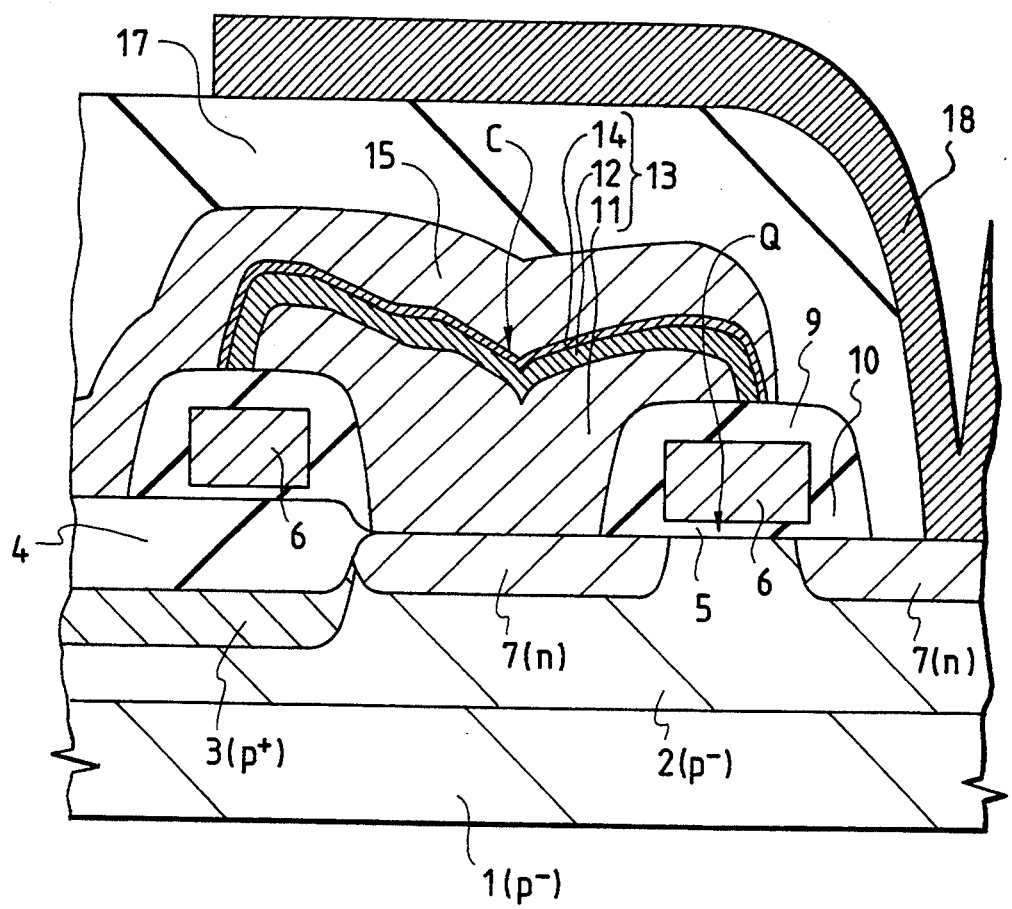
FIG. 1 is a section showing an essential portion of a semiconductor device according to an embodiment 1 of the present invention.

The present invention will be specifically described in the following in connection with the embodiments thereof with reference to the accompanying drawings.

Incidentally, throughout the Figures for explaining the embodiments, the portions having the same functions are designated at the same reference numerals, and their repeated descriptions will be omitted.

EMBODIMENT 1

A semiconductor device according to the embodiment 1 of the present invention will be described with reference to FIG. 1 (showing an essential portion in section).

As shown in FIG. 1, the semiconductor device of the present embodiment 1 is exemplified by a DRAM which includes a memory cell having a selecting MISFET Qs and a capacitor element of stacked structure connected in series.

The semiconductor device is composed of a $p^-$-type semiconductor substrate 1. This $p^-$-type semiconductor substrate 1 is made of single crystal silicon, for example. The $p^-$-type semiconductor substrate 1 has its principal face formed with a $p^-$-type well region 2. This $p^-$-type well region 2 has its inactive region formed over its principal face with an inter-element separating insulating film 4. This inter-element separating insulating film 4 is underlain by a $p^-$-type semiconductor region 3 forming a channel stopper region. The individual elements are insulated and separated from one another mainly by the separating regions composed of the inter-element separating insulating film 4 and the $p^-$-type semiconductor region 3.

The selecting MISFET Qs is formed in the principal plane of the active region of the $p^-$-type well region 2. This selecting MISFET Qs is composed mainly of a gate insulating film 5, a gate electrode 6 and a pair of n-type semiconductor regions 7.

The gate insulating film 5 is formed over the principal face of the $p^-$-type well region 2. This gate insulating film 5 is formed of a silicon oxide film, for example.

The gate electrode 6 is formed over the gate insulating film 5. This gate electrode 6 is formed of a polycrystalline silicon film, for example. The gate electrode 6 is overlain by an insulating film 9. This insulating film 9 is formed of a silicon oxide film, for example. Moreover, the gate electrode 6 is sided with a side wall spacer 10. This side wall spacer 10 is formed of a silicon oxide film, for example.

The paired n-type semiconductor regions 7 are formed in the principal face of the $p^-$-type well region 2 and at the sides of the gate electrode 6. These paired n-type semiconductor regions 7 constitute the source region and the drain region.

The capacitor element C is composed of a lower electrode 13, a charge storing insulating film 14 formed over the lower electrode 13, and an upper electrode 15 formed over the charge storing insulating film 14. The capacitor element C is formed in the region containing the upper portion of the gate electrode 6 of the selecting MISFET Qs.

The lower electrode 13 is connected with one of the paired n-type semiconductor regions 7 of the selecting MISFET Qs. This lower electrode 13 is formed of a laminated film which is composed, for example, of a polycrystalline silicon film 11 and a tungsten film 12 containing tantalum (as will be called the "tantalum/tungsten film"), which are arranged from the lower position. In the present invention, the metal film may be one which is composed of a metal of an element of IVb group or Vb group and an element of VIb group, but the present embodiment 1 will be described by exemplifying a metal film composed of tantalum and tungsten. The tantalum/tungsten film 12 contains about 50 atom % of tantalum, for example. This tantalum/tungsten film 12 is formed by the sputtering method using an alloy target, for example. The tantalum/tungsten film 12 has a thickness of about 500 nm, for example. Incidentally, the tantalum and tungsten composing the tantalum/tungsten film 12 are not a chemical compound but a mixture, and their composition ratio is not especially limited.

The charge storing insulating film 14 is formed of a tantalum oxide film, for example. The tantalum oxide film has a dielectric constant about six times as large as that of the silicon oxide film and larger than that of the silicon oxide film, the silicon nitride film or their laminated film. If the silicon oxide film composing the charge storing insulating film of the prior art has a thickness of about 2 to 3 nm, for example, the charge storing insulating film 14 of the present embodiment may have a thickness of about 18 to 24 nm. On the other hand, the amount of charge to be stored per unit area of the capacitor element C is increased by reducing the thickness of the charge storing insulating film 14. Thus, the size of the capacitor element for retaining the same amount of charge to be stored can be reduced to raise the degree of integration of the semiconductor device.

The upper electrode 15 is formed of a tungsten film, for example. This tungsten film has a thickness of about 100 nm, for example.

The upper electrode 15 is formed thereover with an inter-layer insulating film 17. This inter-layer insulating film 17 is formed of a laminated film in which a BPSG (Boron Phospho Silicate Glass) film is formed over the silicon oxide film.

This inter-layer insulating film 17 is formed thereover with a data line 18. This data line 18 is formed of a tungsten film, for example. This data line 18 is connected with the other of the paired n-type semiconductor regions 7 of the selecting MISFET Qs through a connection hole which is formed in the inter-layer insulating film 17. Moreover, the data line 18 is formed thereover with a not-shown surface passivation film.

Figure 3:
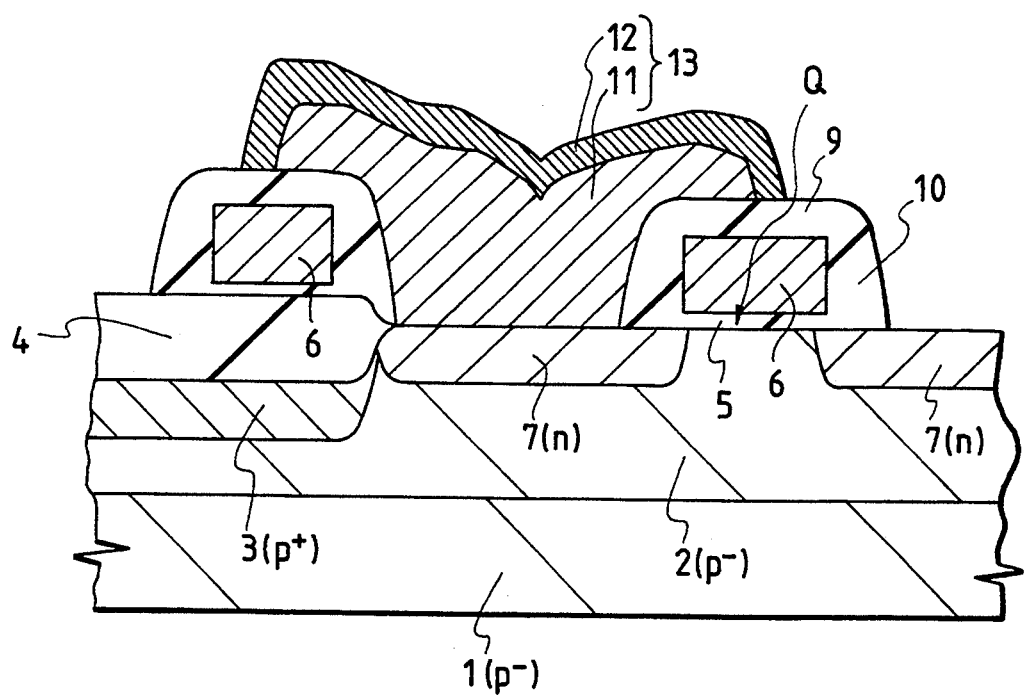
FIG. 3 is a section showing an essential portion at a step of manufacturing the semiconductor device.
Figure 4:
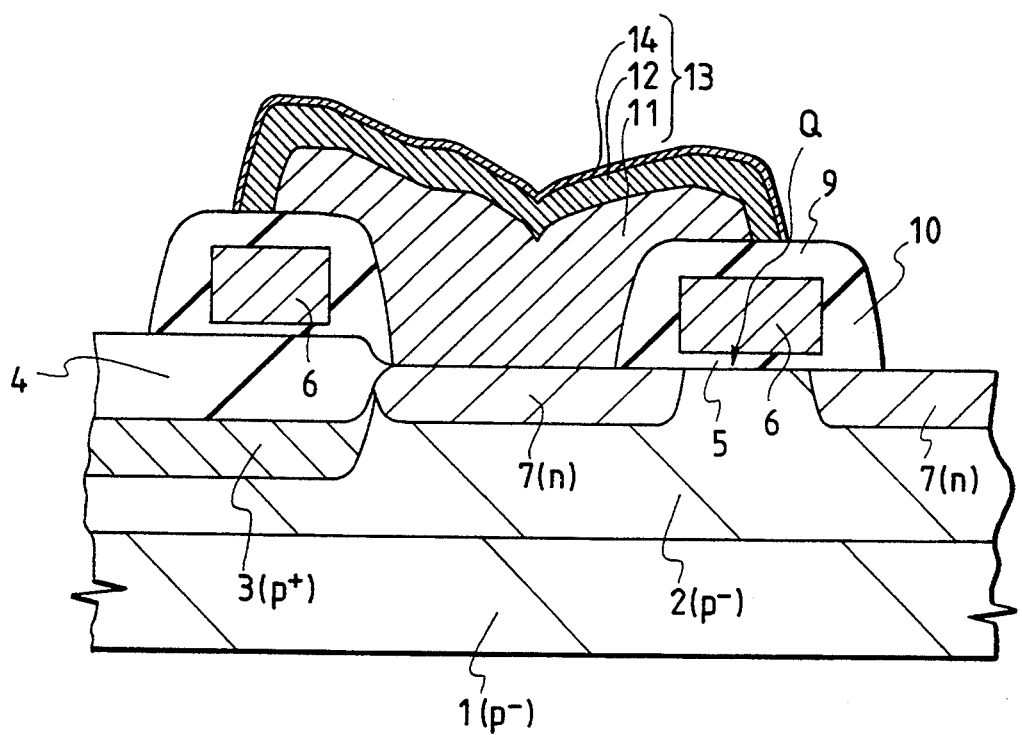
FIG. 4 is a section showing an essential portion at a step of manufacturing the semiconductor device.

Next, the process for manufacturing the semiconductor device according to the present embodiment 1 will be described in the following with reference to FIGS. 2 to 4 (presenting sections of an essential portion at respective steps).

First of all, the p⁻-type semiconductor substrate 1 formed in its principal face with the p⁻-type well region 2, the p⁻-type semiconductor region 3 for forming the channel stopper region, and the inter-element separating insulating film 4.

Next, the principal face of the p⁻-type well region 2 is thermally oxidized to form the gate insulating film 5 of the selecting MISFET Qs. After this, the gate insulating film 5 is formed thereover with the polycrystalline silicon film.

Figure 2:
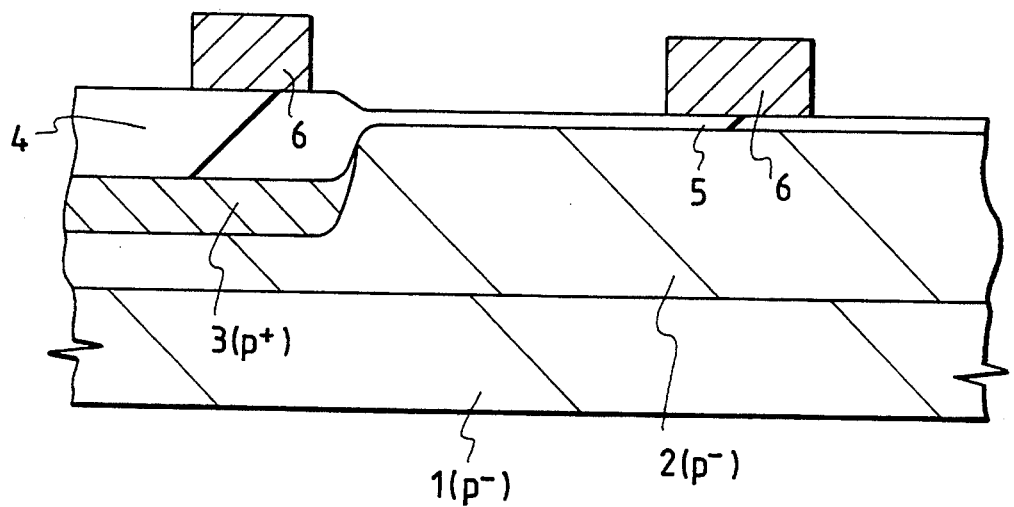
FIG. 2 is a section showing an essential portion at a step of manufacturing the semiconductor device.

Next, the polycrystalline silicon film is patterned by the photolithography technique and the etching technique to form the gate electrode 6 of the selecting MISFET Qs, as shown in FIG. 2. After this, the silicon oxide film is formed and is patterned by the photolithography technique and the etching technique to form the insulating film 9 over the gate electrode 6. On the other hand, the patterning steps of the gate electrode 6 and the insulating film 9 may be once.

Next, the p⁻-type well region 2 has its principal face implanted with ions of an n-type impurity (e.g., As or P) in self-alignment with the gate electrode 6 to form the paired n-type semiconductor regions 7.

Next, the silicon oxide film is deposited. After this, the silicon oxide film is anisotropically etched to an extent corresponding to the deposited thickness to form the side wall spacers 10 at the sides of the gate electrode 6 and the insulating film 9.

Next, the polycrystalline silicon film 11 is deposited by the CVD method, for example. After this, the polycrystalline silicon film 11 is patterned by the photolithography technique or the etching technique.

Next, the tantalum/tungsten film 12 containing about 50 atm % of tantalum is formed by the sputtering method using an alloy target, for example. This tantalum/tungsten film 12 thus formed has a thickness of about 500 nm, for example. After this, the tantalum/tungsten film 12 is patterned by the photolithography technique and the etching technique, as shown in FIG. 3. This step forms the lower electrode 13 formed of the laminated film which is composed of the polycrystalline silicon film 11 and the tantalum/tungsten film 12.

Figure 5:
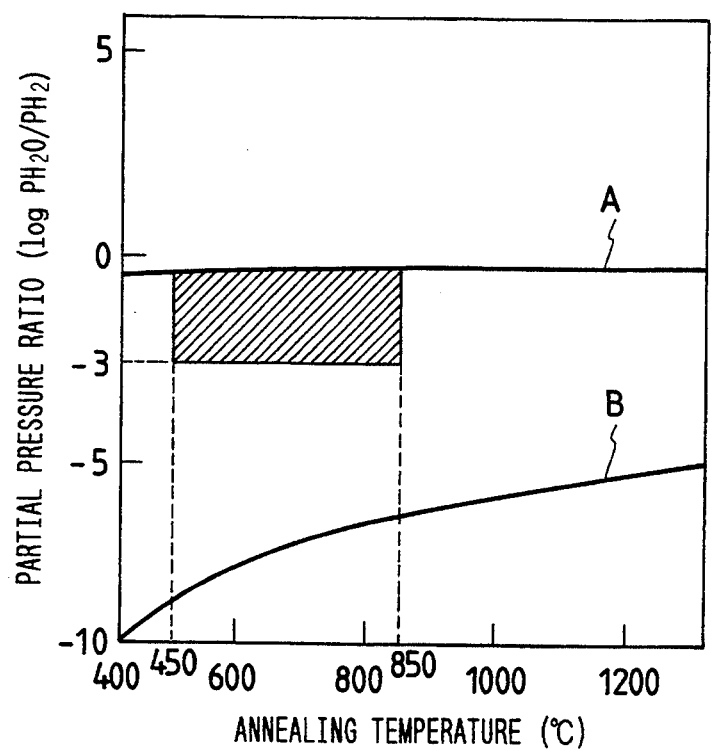
FIG. 5 is a diagram showing partial pressure ratios of steam and hydrogen at the time of forming a charge storing insulating film.

Next, a heat treatment is performed at a temperature of about 700° C. for about 30 minutes. The atmosphere for this heat treatment is composed of a mixture gas containing about 30% of steam and hydrogen under a pressure of about 1 atm, for example. In this heat treatment, the partial pressures of the steam and the hydrogen gas play an important role, and the total pressure need not be elaborately specified. As a result of the heat treatment, the tantalum contained in the tantalum/tungsten film 12 is oxidized to form the tantalum oxide film 14 on the surface of the tantalum/tungsten film 12, as shown in FIG. 4. In other words, the tungsten in the tantalum/tungsten film 12 is not oxidized, but only the tantalum is oxidized. Here, since the tantalum in the tantalum/tungsten film 12 is selectively oxidized, the tantalum oxide partially separates out into the surface of the tantalum/tungsten film 12, and the remaining tantalum oxide resides in the tantalum/tungsten film 12. As a result, the tantalum/tungsten film 12 is composed of the tungsten and the tantalum oxide. The tantalum oxide film 14 thus formed by the heat treatment forms the charge storing insulating film 14 of the capacitor element C. At the time of forming the tantalum oxide film 14, the steam acts as an oxidizing agent, and the hydrogen gas acts as a reducing agent. Here, the aforementioned selective oxidation can be effected in the zone, in which the partial pressure ratio of the steam and hydrogen is defined by curves A and B plotted in FIG. 5 (presenting a diagram showing the partial pressure ratio of the steam and hydrogen at the time of forming the charge storing insulating film). In the zone having a higher partial pressure ratio than the curve A, both the tantalum and tungsten are oxidized to produce a tantalum oxide and a tungsten oxide simultaneously. In the zone having a lower partial pressure ratio than the curve B, neither the tantalum nor tungsten is oxidized. In other words, in the zone defined by the curves A and B, only the tantalum is selectively oxidized, but the tungsten is not oxidized to produce the tantalum oxide and leave the tungsten as it is. In the hatched zone of FIG. 5, moreover, the selective oxidation of the tantalum oxide film can be more effectively accomplished. Incidentally, the condition shown in FIG. 5 corresponds to the case, in which the total pressure is at 1 atm, but this total pressure need not be especially specified, as has been described hereinbefore. In FIG. 5, the annealing temperature of the hatched zone is from 450° C. to 850° C. This range is specified by the controllability of the oxidizing rate. Specifically, at an excessively high temperature, the oxidizing rate is so high that the film thickness is difficult to control. At a low temperature, on the other hand, the oxidizing rate is so low that the throughput is deteriorated. Moreover, the partial pressure ratio has its lower limit specified by −3 for a range in which the flow rates of the steam and hydrogen can be easily controlled.

Since, moreover, the polycrystalline silicon film 11 is interposed between the tantalum/tungsten film 12 and the principal face of the n-type semiconductor region 7, it is possible at the oxidation step of forming the tantalum oxide film 14 to reduce such a transition in the principal face of the n-type semiconductor region 7 as might otherwise be caused by the intrusion of the tungsten or tantalum from the tantalum/tungsten film 12 through the polycrystalline silicon film 11.

Next, a tungsten film having a thickness of about 100 nm is formed over the charge storing insulating film 14 by the sputtering method, for example. After this, the tungsten film is patterned by the photolithography technique or etching technique to form the upper electrode 15 of the capacitor element C.

Next, the silicon oxide film and the BPSG film are sequentially formed over the upper electrode 15 to form the inter-layer insulating film 17. After this, the BPSG film composing the inter-layer insulating film is subjected to the reflow treatment.

Next, the inter-layer insulating film 17 is formed with a connection hole for connecting the data line (18). After this, the tungsten film is formed and patterned by the photolithography technique and the etching technique to form the data line 18, as shown in FIG. 1. After this, the not-shown surface passivation film is formed to complete the semiconductor device of the present embodiment 1.

As has been described hereinbefore, according to the manufacture process of the present embodiment 1, the tantalum oxide film for composing the charge storing insulating film 14 is selectively formed from the tantalum/tungsten film composed of tantalum and tungsten, so that the tantalum/tungsten film 12 functions as a barrier layer. As a result, no reduction will occur between the polycrystalline silicon film composing the lower electrode 13 and the tantalum oxide film composing the charge storing insulating film. Thus, the silicon oxide film need not be formed over the polycrystalline silicon film 11 so that the charge storing insulating film 14 can be formed of a single-layer film of the tantalum oxide film.

Since, moreover, no silicon exists in the interface between the tantalum/tungsten film 12 and the tantalum oxide film, no silicon oxide film is formed in the interface between the tantalum/tungsten film 12 and the tantalum oxide film. Thus, the charge storing insulating film 14 can be formed of the single-layer film of the tantalum oxide film.

In case, on the other hand, the tantalum in the tantalum/tungsten film 12 is selectively oxidized, the tantalum oxide film separates onto the surface of the tantalum/tungsten film 12. The tantalum oxide film thus having separated has its growth stopped at a constant thickness. This phenomenon is considered as a kind of grain segregation. Thus, even if the tantalum/tungsten film 12 is sufficiently oxidized, only the tantalum oxide film is selectively formed.

Since the charge storing insulating film 14 can be thus formed of the single-layer film of the tantalum oxide film, its dielectric constant is higher than that of the case in which it is formed of the single-layer film of the silicon oxide film, the laminated film of the silicon oxide film and the silicon nitride film, or the laminated film of the silicon oxide film and the tantalum oxide film. As a result, a dielectric film having a high dielectric constant can be formed by the process for manufacturing the semiconductor device. Since the amount of charge to be stored per unit area of the charge storing insulating film 14, the size of the capacitor element C can be reduced to integrate the semiconductor device highly.

Figure 6:
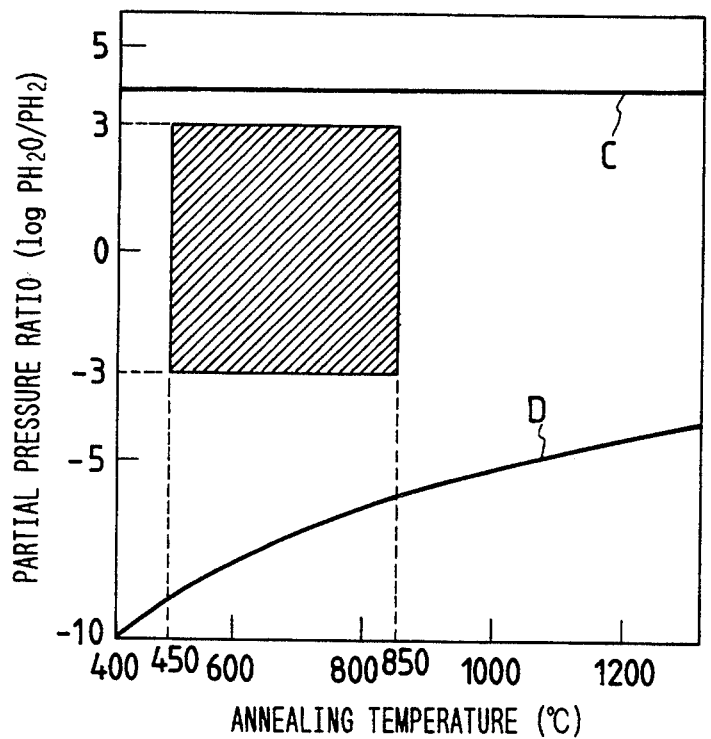
FIG. 6 is a diagram showing partial pressure ratios of steam and hydrogen at the time of forming a charge storing insulating film.

Incidentally, the present embodiment 1 is exemplified by forming the tantalum oxide film from the tantalum/tungsten film 12, but the tantalum oxide film can also be formed from a molybdenum film containing tantalum (i.e., a tantalum/molybdenum film). In this case, the selective oxidation for forming the tantalum oxide film can be effected within a zone which is defined by curves C and D, as shown in FIG. 6 (presenting a diagram plotting the partial pressure ratio of steam and hydrogen at the time of forming the charge storing insulating film. In the zone having a higher partial pressure ratio than the curve C, both the tantalum and molybdenum are oxidized to form a tantalum oxide and a molybdenum oxide simultaneously. In the zone having a lower partial pressure ratio than the curve D, neither the tantalum nor the molybdenum is oxidized. In other words, in the zone defined by the curves C and D, only the tantalum is selectively oxidized, but the molybdenum is not oxidized to produce the tantalum oxide and leave the molybdenum as it is. In the hatched zone of FIG. 6, the selective oxidation of the tantalum oxide film can be accomplished more effectively. Incidentally, the condition shown in FIG. 6 corresponds to the case, in which the total pressure is at 1 atm, but this total pressure need not be especially specified, as has been described hereinbefore. In FIG. 6, the annealing temperature of the hatched zone is from 450° C. to 850° C. This range is specified by the controllability of the oxidizing rate. Specifically, at an excessively high temperature, the oxidizing rate is so high that the film thickness is difficult to control. At a low temperature, on the other hand, the oxidizing rate is so low that the throughput is deteriorated. Moreover, the partial pressure ratio has its upper limit specified by 3 and its lower limit specified by −3 for a range in which the flow rates of the steam and hydrogen can be easily controlled.

Here, the tantalum in the tantalum/tungsten film 12 functions as a stopper against the oxidizing agent. Thus, it is possible to reduce a conduction trouble which might otherwise be caused by the silicon oxide film formed in the interface between the tantalum/tungsten film 12 and the polycrystalline silicon film 11 when the oxidizing agent reaches the polycrystalline silicon film 11.

Moreover, the content of the tantalum in the tantalum/tungsten film 12 may be sufficient if it can retain the thickness of the tantalum oxide film to be formed by the oxidation and if the tantalum functions as the stopper against the oxidizing agent.

EMBODIMENT 2

Here will be described in the following a process for manufacturing a semiconductor device according to the embodiment 2 of the present invention.

According to the process for manufacturing a semiconductor device of the present embodiment 2, in the semiconductor device manufacturing process of the foregoing embodiment 1, the tantalum oxide film 14 is formed over the tantalum/tungsten film 12 by the CVD method, for example, and is then oxidized under the condition specified in the embodiment 1.

In case a tantalum film is formed in place of the tantalum/tungsten film 12 and is formed thereover with the tantalum oxide film 14, it is difficult to control the thickness of the tantalum oxide film to be formed at the oxidation step. In case, on the other hand, a tungsten film is formed in place of the tantalum/tungsten film 12 and thereover with the tantalum oxide film 14 and is oxidized, no metal oxide is produced in the interface between the tantalum oxide film 14 and the tungsten film. In the manufacture process of the present embodiment 2, therefore, the tantalum/tungsten film 12 containing the tantalum or metal to be oxidized at the oxidation step is formed, as has been described hereinbefore, and thereover with the tantalum oxide film 14 and is oxidized.

The tantalum oxide film 14 is formed at a temperature of about 420° C. and under a pressure of about 79.99 Pa by using about 500 sccm (Standard Cubic Centimeter per Minute: the flow rate in the standard state of gas) of oxygen and about 500 sccm of nitrogen and by bubbling pentaethoxytantalum $(Ta(OC_2H_5)_5)$. This tantalum oxide film thus formed has a thickness of about 18 to 24 nm or less as in the embodiment 1.

As has been described hereinbefore, according to the process for manufacturing the semiconductor device of the present embodiment 2, even in case the tantalum oxide film 14 deposited over the tantalum/tungsten film 12 has a dispersion in its thickness, the tantalum in the underlying tantalum/tungsten film 12 is oxidized in the thin region (or weak spot) of the tantalum oxide film 14 so that the tantalum oxide film separates onto the surface of the tantalum/tungsten film 12. In this instance, the tantalum in an amount to be consumed in the interface between the tantalum/tungsten film 12 and the tantalum oxide film 14 diffuses out of the tantalum/tungsten film 12 into the interface between the tantalum/tungsten film 12 and the tantalum oxide film 14 so that the thickness of the tantalum oxide film 14 to be formed can be easily controlled. The thickness of the tantalum oxide film 14 in the thin region is enlarged by the tantalum oxide film formed by that oxidation. Moreover, the tantalum oxide film to separate onto the surface of the tantalum/tungsten film 12 has its growth stopped at a constant thickness. Thus, the tantalum oxide film 14 formed over the tantalum/tungsten film 12 can be sufficiently oxidized to reduce the dispersion in the thickness of the tantalum oxide film 14. As a result, the breakdown voltage of the charge storing insulating film can be improved to improve the reliability of the semiconductor device.

Incidentally, the tantalum/tungsten film 12 of the present embodiment 2 can be replaced by the tantalum/molybdenum film having been described in connection with the foregoing embodiment 1. The oxidizing conditions of this case are similar to those described in the embodiment 1.

EMBODIMENT 3

Figure 7:
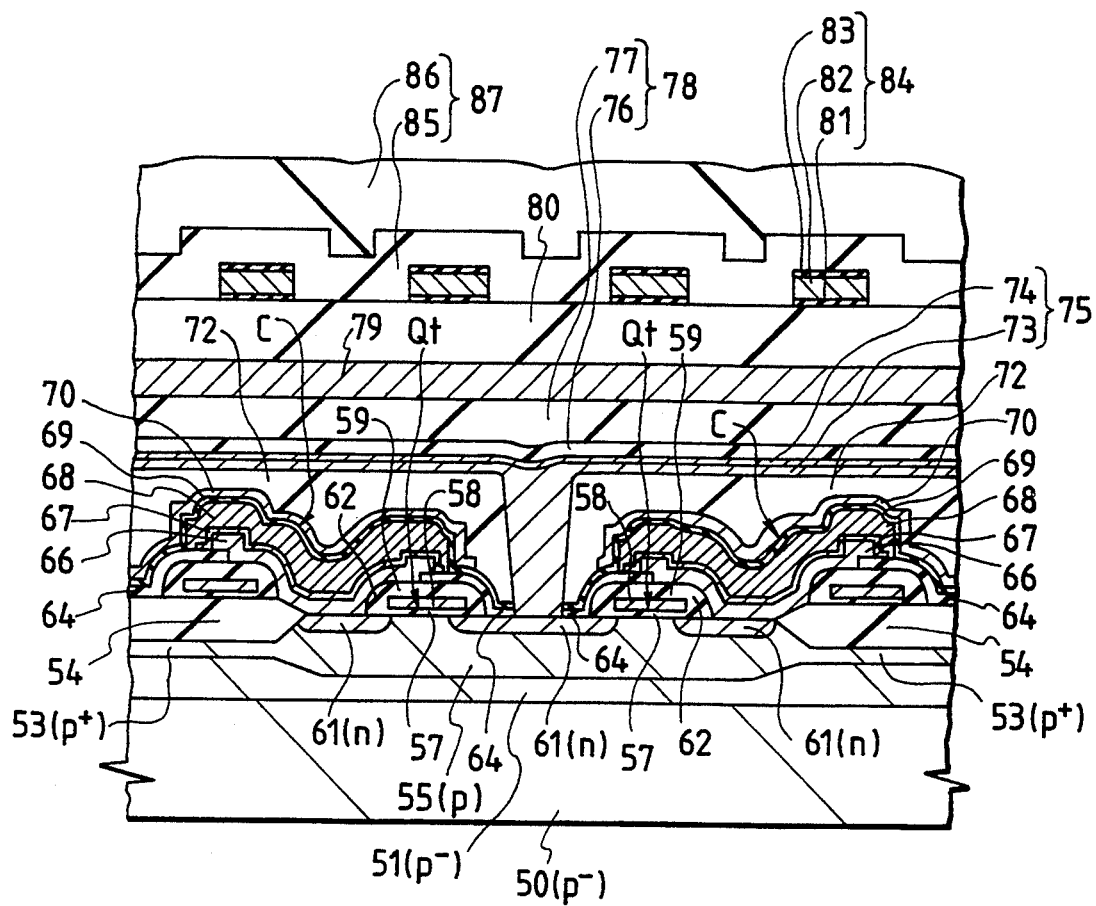
FIG. 7 is a section showing an essential portion of a semiconductor device according to an embodiment 3 of the present invention.

Next, the structure of a semiconductor device according to the embodiment 3 of the present invention will be described with reference to FIG. 7 (showing an essential portion in section). As shown in FIG. 7, the semiconductor device of the present embodiment 3 is a DRAM including a memory cell having a selecting MISFET Qs and a capacitor element C of stacked structure like the foregoing embodiment 1. This memory cell stores information of 1 bit. Incidentally, any peripheral circuit is not shown in FIG. 7, and its description will be omitted.

The semiconductor device is constructed of a $p^-$-type semiconductor substrate 50. This $p^-$-type semiconductor substrate 50 is made of single-crystal silicon, for example.

The selecting MISFET Qs is formed, as shown in FIG. 7, in the principal face of a p-type semiconductor region 55 in the active region which is surrounded and defined by the element isolating region. This selecting MISFET Qs is composed mainly of a channel forming region (or the p-type semiconductor region 55), a gate insulating film 57, a gate electrode 58, and a pair of n-type semiconductor regions 61 to be used as the source region and the drain region.

The element isolating region is composed mainly of an inter-element isolating insulating film (or a field insulating film) 54 and a $p^-$-type semiconductor region (corresponding to the p-type channel stopper region) underlying the inter-element isolating insulating film 54.

The $p^-$-type semiconductor region 53 to be used as the element isolating region and the p-type semiconductor region 55 to be used as the channel forming region of the selecting MISFET Qs are individually formed over the principal face of the $p^-$-type well region 51. This $p^-$-type well region 51 is formed over the principal face of the $p^-$-type semiconductor substrate 50. The p-type semiconductor region 55 constitutes a potential barrier, especially in the region to be arranged with the memory cell, against the minority carriers which are generated by alpha rays incident upon either the $p^-$-type well region 51 or the $p^-$-type semiconductor substrate 50.

The gate insulating film 57 of the selecting MISFET Qs is formed over the p-type semiconductor region 55. This gate insulating film 57 is formed of a silicon oxide film, for example.

The gate electrode 58 is formed over the gate insulating film 57. This gate electrode 58 is formed of a polycrystalline silicon film, for example. The polycrystalline silicon film is formed at the step of forming a first-layer gate material in the manufacture process. The polycrystalline silicon film is deposited by the CVD method. Moreover, the polycrystalline silicon film is doped during or after its deposition with an impurity such as an n-type impurity for reducing the resistance. The gate electrode 58 is integrated and electrically connected in its gate width direction with the word line (WL) 58 (namely, formed of the same conductive layer). With a view to accelerating the operating speed of the selecting MISFET Qs, on the other hand, the gate electrode 58 may be formed of: either a single-layer film of a refractory metal film or its silicide film; or a laminated film which is formed by laminating a refractory metal film or its silicide film over the polycrystalline silicon film.

The gate electrode 58 is formed thereover with an insulating film 59. This gate electrode 58 is sided (as its side walls) with an insulating side wall spacer (or a side wall insulating film) 62. Likewise, the word line 58 is formed thereover with the insulating film 59 and is sided with the side wall spacer 62. Each of these insulating film 59 and side wall spacer 62 is provided for coating the surface of a portion of the gate electrode 58 or the word line 58. These insulating film 59 and side wall spacer 62 constitute insulating films for coating the entirety (including the top face and side) of the gate electrode 58 or the whole surface of the word line 58. Either of the insulating film 59 or the side wall spacer 62 is formed in self-alignment with the gate electrode 58 or the word line 58. Each of these insulating film 59 and side wall spacer 62 is formed of a silicon oxide film deposited by the CVD method, for example.

The n-type semiconductor region 61 to be used as either the source region or the drain region is formed in the principal portion of the p-type semiconductor region 55. This n-type semiconductor region 61 is formed in self-alignment with the side of the gate electrode 58. The n-type semiconductor region 61 is formed at the same manufacture step (or corresponds to the same conductive layer) as that of the lightly doped n-type semiconductor region constituting the source region or drain region of an n-channel MISFET Qn of a not-shown peripheral circuit. The n-channel MISFET Qn adopts the LDD structure, and the lightly doped n-type semiconductor region is used as the LDD portion of the n-channel MISFET Qn. Thus, the selecting MISFET Qs substantially acquires the LDD structure because at least its drain region is formed of the lightly doped n-type semiconductor region 61.

Although not shown in FIG. 7, the n-type impurity is diffused into either of the source region or drain region of the selecting MISFET Qs from a polycrystalline silicon film 66 constituting the lower electrode of the capacitor element C. As a result, there are formed the n-type semiconductor region 61 having a low impurity concentration and the diffused $n^+$-type semiconductor region having a high impurity concentration.

The capacitor element C is constructed, as shown in FIG. 7, of the so-called "stacked structure", in which the lower electrode, a charge storing insulating film 69 and an upper electrode 70 are sequentially laminated over the selecting MISFET Qs.

The lower electrode is formed of a laminated film which is prepared by laminating the polycrystalline silicon film 66, a titanium nitride 67 and a tungsten film containing tantalum (i.e., tantalum/tungsten film) 68 from the lower side.

The lower electrode thus constructed has its central portion electrically connected with the other n-type semiconductor region 61 of the selecting MISFET Qs and its peripheral portion extended over the gate electrode 58 of the selecting MISFET Qs and over the other word line 58 extended adjacent to the word line 58 connected with that gate electrode 58. This lower electrode is connected, in the region defined between the gate electrode 58 and the other word line 58, with the other n-type semiconductor region 61 through a connection hole which is formed in an inter-layer insulating film 64. The lower electrode and the gate electrode 58 are insulated through the insulating film 59 and the side wall spacer 62 coating at least the surface of the gate electrode 58. The lower electrode is connected along the surfaces of the insulating film 59 and the side wall spacer 62 with the other n-type semiconductor region 61 in self-alignment with the gate electrode 58.

The polycrystalline silicon film 66 has a thickness of about 200 nm. This polycrystalline silicon film is deposited by the CVD method. The polycrystalline silicon film 66 is doped during or after its deposition with an impurity such as an n-type impurity for reducing its resistance.

The titanium nitride film 67 is formed to cover the surface of the polycrystalline silicon film 66. This titanium nitride film 67 has a thickness of about 100 to 200 nm, for example. The titanium nitride film 67 is formed by the sputtering method, for example. The titanium nitride film 67 functions as an oxidation resisting film for reducing oxidation of the polycrystalline silicon film 66, as will be described hereinafter.

The tantalum/tungsten film 68 has a tantalum content of about 50 atom %, for example. This tantalum/tungsten film 68 is formed by the sputtering method using an alloy target, for example. The tantalum/tungsten film 68 has a thickness of about 500 nm, for example.

The lower electrode is made as thick as about 900 nm as the total thickness of the laminated film, for example, with a view to having its side surrounded by the charge storing region to increase the amount of charge to be stored. Moreover, the lower electrode is formed at its central portion with steps corresponding to the total thickness of the gate electrode 58 and the insulating film 59 and the total thickness of the word line 58 and the insulating film 59 so that the amount of charge to be stored can be increased in the height direction by making use of the stepped shapes.

The lower electrode thus constructed corresponds to the storing node region for storing information to be stored in the memory cell and is arranged for each memory and independently of another adjacent memory cell.

The charge storing insulating film 69 is formed along the upper face and side of the tantalum/tungsten film 68. This charge storing insulating film 69 is formed of the tantalum oxide film, for example. The dielectric constant of the tantalum oxide film is six times as high as that of the silicon oxide film and higher than that of the silicon oxide film, the silicon nitride film or their laminated film. The thickness of the tantalum oxide film is about 18 to 24 nm or less, for example. Thus, the size of the capacitor element C for retaining the same amount of charge to be stored, thereby to integrate the semiconductor device highly.

The upper electrode 70 is formed on the upper and side faces of the lower electrode through the charge storing insulating film 69. This upper electrode 70 is constructed integrally and connected electrically with the upper electrode 70 of the capacitor element C of the memory cell and the upper electrode 70 of the capacitor element C of another memory cell arranged adjacent to the periphery of the former capacitor element C and is constructed as a plate electrode shared among a plurality of memory cells arranged in a memory cell array. The upper electrode 70 is formed of a tungsten film, for example. This tungsten film is formed by the sputtering method, for example. The memory cell uses a conductive layer composed of at least three layers so that it has a large stepped shape. In order to reduce the height of the step, therefore, the tungsten film is formed of a thin film of about 100 nm, for example.

In the memory cell thus constructed, as shown in FIG. 7, a complementary bit line (BL) 75 is electrically connected with one n-type semiconductor region 61 of the selecting MISFET Qs. This complementary bit line 75 is extended over the surface of an inter-layer insulating film 72 and is connected with one n-type semiconductor region 61 through a connection hole (i.e., a bit line contact hole) formed in that inter-layer insulating film 72.

The inter-layer insulating film 72 is composed of a silicon oxide film and a BPSG film laminated over the former film. The silicon oxide film is formed by the CVD method, for example. The BPSG film is formed by the CVD method, for example.

The complementary bit line 75 is formed, for example, of a laminated film composed of a polycrystalline silicon film 73 and a refractory metal nitride film 74 laminated over the former film. The polycrystalline silicon film 73 is deposited by the CVD method, for example. This polycrystalline silicon film 73 is doped during or after its deposition with an impurity such as an n-type impurity for reducing its resistance. The refractory metal nitride film 74 is formed of a tungsten silicide film which is deposited by the sputtering method or the CVD method, for example.

The complementary bit line 75 is formed thereover with a data line (DL) 79 through an inter-layer insulating film 78.

The inter-layer insulating film 78 is composed of an underlying silicon oxide film 76 and a BPSG film 77 laminated over the former film. The silicon oxide film 76 is deposited by the CVD method, for example. The BPSG film 77 is formed by the CVD method, for example.

The data line 79 is formed at the first-layer wiring step in the manufacture process. This data line 79 is formed of a laminated film of a refractory metal film, for example. The underlying refractory metal film is exemplified by a tungsten film. This tungsten film is formed by the sputtering method, for example. The overlying refractory metal film is exemplified by a tungsten film deposited by the CVD method, for example.

The data line 79 is overlain by a shunting word line (WL) 84 through an inter-layer insulating film 80.

This inter-layer insulating film 80 is composed of a three-layered silicon oxide films. The lower silicon oxide film composing the inter-layer insulating film 80 is formed, for example, by the plasma CVD method using TEOS (Tetra Ethoxyl Ortho Silane) as its raw material. The intermediate silicon oxide film composing the inter-layer insulating film 80 is formed of an SOG (Spin On Glass) film, for example. The upper silicon oxide film composing the inter-layer insulating film 80 is formed, like the lower silicon oxide film, by the plasma CVD method using the TEOS gas as its raw material.

The shunting word line 84 is formed at the step of forming the second-wiring material in the manufacture process. This shunting word line 84 is formed, for example, of the three-layered structure which is prepared by laminating a titanium/tungsten film 81, an aluminum alloy film 82 and a titanium/tungsten film 83 sequentially, for example. The titanium/tungsten films 81 and 83 are deposited by the sputtering method, for example. The aluminum alloy film 82 contains silicon and copper. This aluminum alloy film 82 is deposited by the sputtering method, for example.

The shunting word line 84 is connected with the lower word line 58 in any of the regions at the ends of the memory cell array (or memory cell mat) and between the memory cell arrays. These shunting word line 84 and word line 58 are individually connected through an intermediate conductive layer formed of the same conductive layer as the data line 79 and the same conductive layer as the complementary bit line 75.

The shunting word line 84 is formed thereover with a final passivation film 87. This final passivation film 87 is formed, for example, of a three-layered structure in which a silicon oxide film 85, a silicon nitride film 86 and a not-shown resin film are sequentially laminated. The silicon oxide film 85 is deposited by the plasma CVD method using a TEOS gas to be produced at a low temperature as its raw material. The silicon nitride film 86 is deposited by the plasma CVD method, for example. The not-shown resin film is formed, for example, of a polyimide resin film which is applied by the rotary method and set.

Next, the process for manufacturing the semiconductor device thus far described will be described in the following with reference to FIGS. 8 to 14 (presenting sections showing an essential portion of FIG. 7 in an enlarged scale at individual steps). Here will be omitted the presentation and description of the peripheral circuit.

First of all, there is prepared the p$^-$-type semiconductor substrate 50 made of single-crystal silicon. After this, the p$^-$-type well region 51 is formed on the principal face of the p$^-$-type semiconductor substrate 50.

Next, the well-known selective thermal oxidizing technique is used to form the inter-element isolating insulating film 54 on the principal face of the inactive region (i.e., element isolating region) of the p$^-$-type well region 51.

At substantially the same forming step as that of forming the inter-element isolating insulating film 54, the p$^+$-type semiconductor region 53 is formed below the inter-element isolating insulating film 54 and on the principal face of the p$^-$-type well region 51. The p$^+$-type semiconductor region 53 constitutes a channel stopper region and has its impurity concentration set slightly higher than that of the p$^-$-type well region 51.

Next, the p$^-$-type well region 51 is formed therein with the p-type semiconductor region 55. This p-type semiconductor region 55 is slightly more highly doped than the p$^-$-type well region 51. The p-type semiconductor region 55 is formed as a potential barrier in a deeper position from the principal face of the p$^-$-type well region 51 than the p-type semiconductor region 55 below the inter-element isolating insulating film 54.

Next, the principal face of the p$^-$-type well region 51 has its active region doped with an impurity for adjusting the threshold voltage of the MISFET. After this, the principal face of the active region of the p$^-$-type well region 51 is thermally oxidized to form the gate insulating film 57.

Next, polycrystalline silicon is deposited over the gate insulating film 57 by the CVD method, for example. This polycrystalline silicon film is formed at the step of forming the first-layer gate material. This polycrystalline silicon film and the polycrystalline silicon film to be formed at a later step are doped with an n-type impurity such as P. After this, the insulating film 59 such as a silicon oxide film is deposited over that polycrystalline silicon film by the CVD method.

Next, the laminated film of the polycrystalline silicon film and the insulating film 59 is patterned to form the gate electrode 58 by the photolithography technique and the etching technique. At the same manufacture step as that of forming the gate electrode 58, the word line 58 is formed in the inactive region (i.e., over the inter-element isolating insulating film 54). At the same manufacture step as that of forming the insulating film 59, there is formed the insulating film 59 for coating the upper face of the word line 58.

Next, the p-type semiconductor region 55 has its principal face implanted with the ions of an n-type impurity such as P to form an n-type semiconductor region 61 for constituting the source region or drain region of the selecting MISFET Qs. For this introduction of the n-type impurity, the gate electrode 58 and the insulating film 39 (or a photo resist film for their patternings) are used as the main component of the impurity introducing mask. When this n-type semiconductor region 61 is formed, the selecting MISFET Qs is substantially completed.

Figure 8:
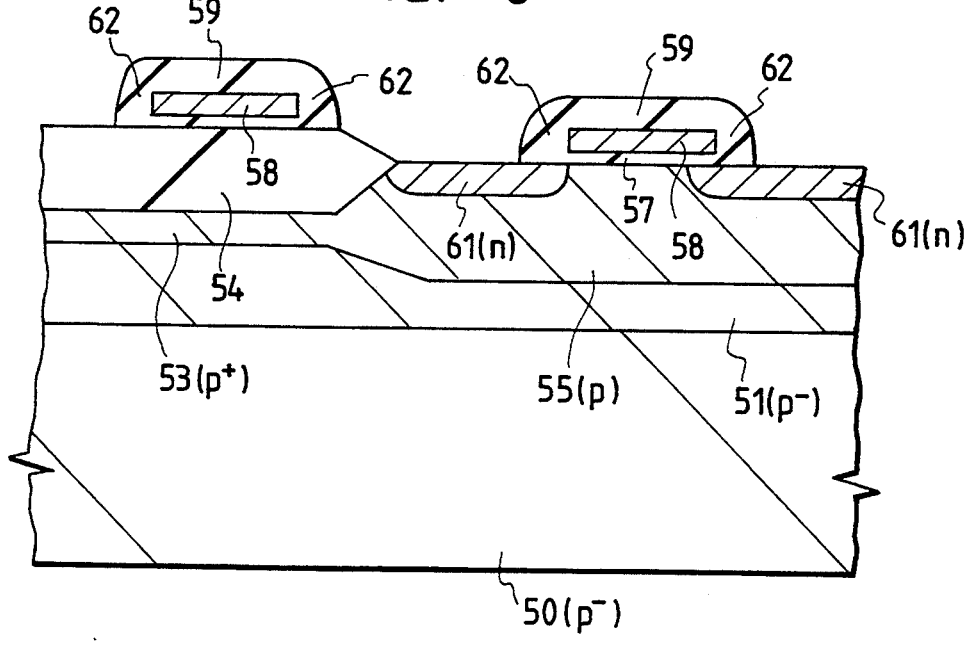
FIG. 8 is a section showing an enlarged essential portion of FIG. 7 at each step.

Next, the gate electrode 58 (containing the word line 58) of the selecting MISFET Qs and the insulating film 59 are formed with the side wall spacer 62, as shown in FIG. 8. This side wall spacer 62 is formed by depositing the silicon oxide film by the CVD method, for example, and by anisotropically etching the silicon oxide film by the RIE or the like to an extent corresponding to the thickness of the deposited film. The side wall spacer 62 is formed in self-alignment with the gate electrode 58 (and the word line 58). By this step of forming the side wall spacer 62 moreover, there is completed an insulating film for coating all the surfaces (i.e., the top faces and sides) of the gate electrode 58 and the word line 58 together with the insulating film (for coating the individual upper faces of the gate electrode 58 and the word line 58) formed in advance.

Next, the inter-layer insulating film 64 is formed. This inter-layer insulating film 64 is formed of a silicon oxide film deposited by the CVD method, for example, to have a thickness of about 150 to 250 nm. The inter-layer insulating film 64 is formed with a view to forming the connection hole for connecting the other n-type semiconductor region 61 of the selecting MISFET Qs and the lower electrode of the capacity element C. On the other hand, the inter-layer insulating film 64 is formed with a view to insulating the gate electrode 58 (and the word line 58) of the selecting MISFET Qs and the lower electrode of the capacity element C. Moreover, the inter-layer insulating film 64 is also used as an etching stopper layer for patterning the charge storing insulating film 69 of the capacity element C and the upper electrode 70.

Next, the inter-layer insulating film 64 over the other n-type semiconductor region 61 of the selecting MISFET Qs is removed to form the connection hole for exposing the surface of the other n-type semiconductor region 61 to the outside. This connection hole is formed to have its open end overlapped over the gate electrode 58 of the selecting MISFET Qs and the word line 58 to be connected with the adjacent memory cell.

Figure 9:
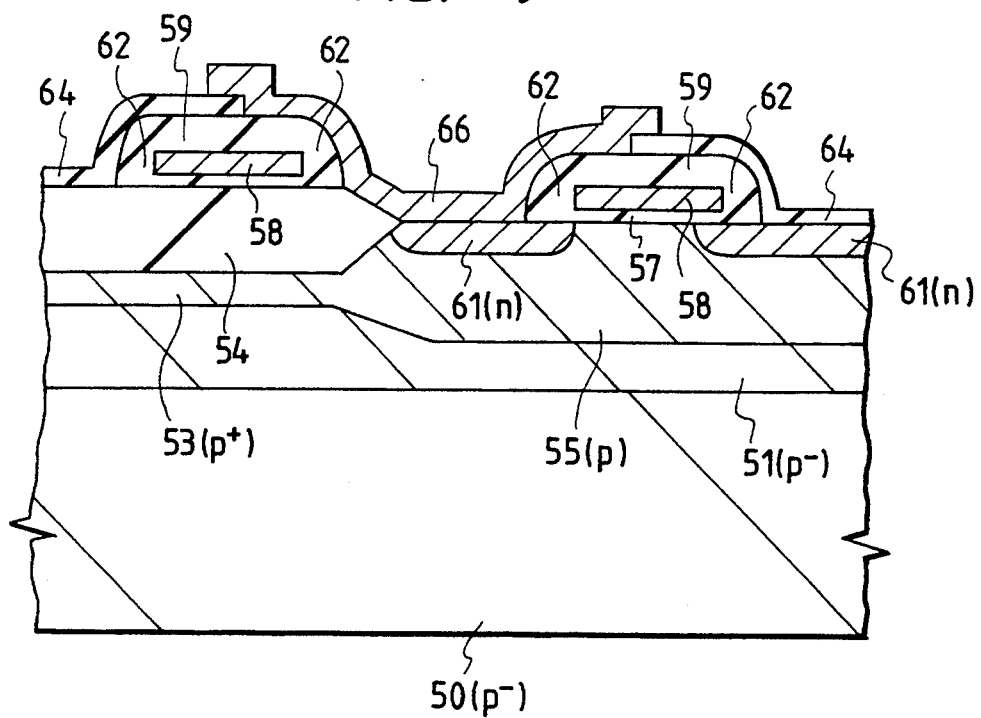
FIG. 9 is a section showing an enlarged essential portion of FIG. 7 at each step.

Next, the polycrystalline silicon film 66 is deposited by the CVD method, for example. This polycrystalline silicon film 66 is formed to have a thickness of about 200 nm, for example. After this, the polycrystalline silicon film 66 is patterned by the photolithography technique and the etching technique, as shown in FIG. 9. The polycrystalline silicon film is connected with the other n-type semiconductor region 61 of the selecting MISFET Qs through the connection hole formed in the inter-layer insulating film 64.

Figure 10:
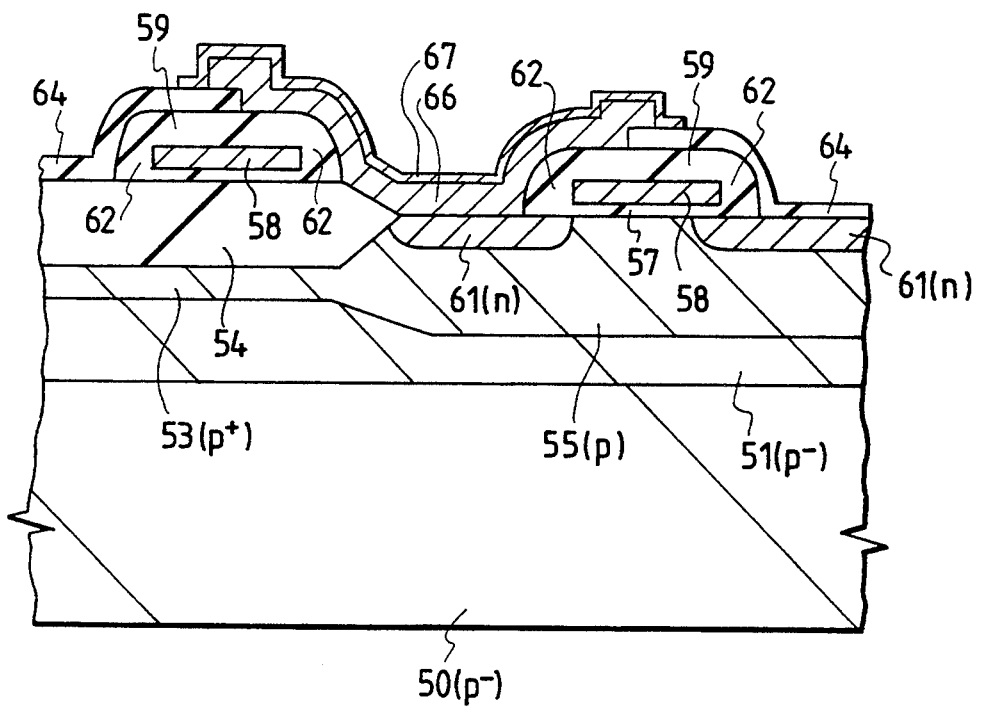
FIG. 10 is a section showing an enlarged essential portion of FIG. 7 at each step.

Next, the titanium nitride film 67 is deposited by the sputtering method, for example. This titanium nitride film 67 is formed to have a thickness of about 100 nm, for example. After this, the titanium nitride film 67 is patterned by the photolithography technique and the etching technique, as shown in FIG. 10.

Figure 11:
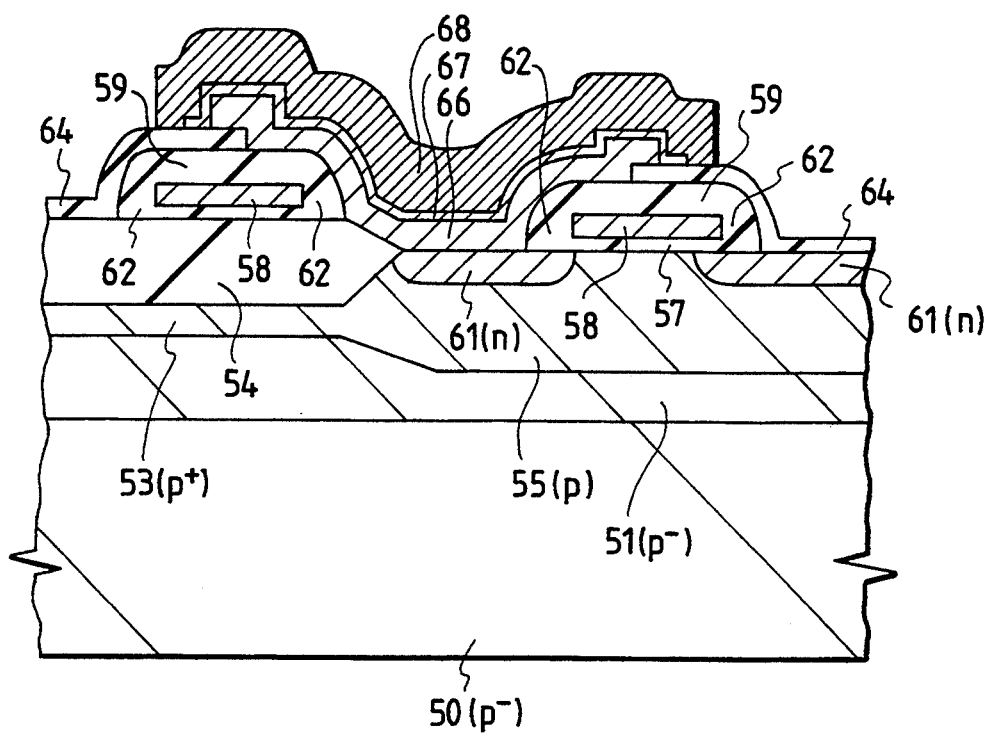
FIG. 11 is a section showing an enlarged essential portion of FIG. 7 at each step.

Next, the tantalum/tungsten film 68 is formed by the sputtering method using an alloy target, for example. This tantalum/tungsten film 68 contains about 50 atm % of tantalum. This tantalum/tungsten film 68 thus formed has a thickness of about 500 nm. After this, the tantalum/tungsten film 68 is patterned by the photolithography technique and the etching technique, as shown in FIG. 11.

Figure 12:
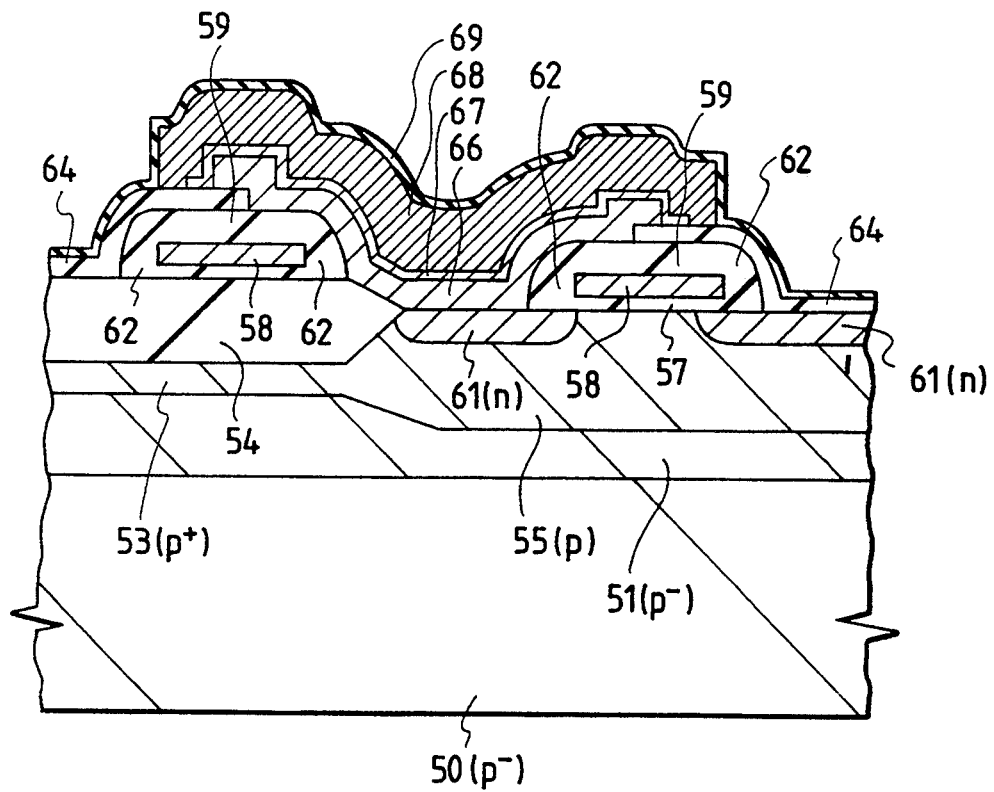
FIG. 12 is a section showing an enlarged essential portion of FIG. 7 at each step.

Next, the charge storing insulating film 69 is formed, as shown in FIG. 12. This charge storing insulating film 69 is formed by forming a tantalum oxide film such that pentaethoxytantalum is bubbled by using as its carrier gas about 500 sccm of oxygen and about 500 sccm of nitrogen, for example, at a temperature of about 420° C. and under a pressure of about 49.99 Pa. This tantalum oxide film is formed like the foregoing embodiment 2 to have a thickness of about 18 to 24 nm or less, for example.

Next, a heat treatment for about 30 minutes is accomplished at a temperature of about 700° C. The atmosphere for this heat treatment is exemplified by a mixture gas of about 30% of steam and hydrogen gas under 1 Pa. The partial pressure at this time may be so set as is shown in FIG. 5 of the foregoing embodiment 1. Thanks to this heat treatment, even in case the thickness of the tantalum oxide film 69 has a dispersion, the tantalum in the underlying tantalum/tungsten film 68 is oxidized in the thin region (or weak spot) of the tantalum oxide film 69, so that the tantalum oxide film separates onto the surface of the tantalum/tungsten film 68. At this time, the tantalum in an amount to be consumed at the interface between the tantalum/tungsten film 68 and the tantalum oxide film diffuses out of the tantalum/tungsten film 68 into the interface between the tantalum/tungsten film 68 and the tantalum oxide film, so that the thickness of the tantalum oxide film to be formed can be easily controlled. In other words, the tantalum oxide film to separate onto the surface of the tantalum/tungsten film 68 has its growth stopped at a constant thickness. As a result, the tantalum oxide film in the thin region is thickened by the tantalum oxide formed by the heat treatment so that its thickness dispersion can be reduced. As a result, the breakdown voltage of the charge storing insulating film 69 can be improved to improve the reliability of the semiconductor device.

Moreover, the titanium nitride film 67 formed between the tantalum/tungsten film 68 and the polycrystalline silicon film 66 functions as an oxidation resisting film at the heat treating step after the tantalum oxide film has been deposited. Thus, at this heat treating step, the oxidation of the polycrystalline silicon film 66 can be further reduced. Moreover, the reaction between the tantalum/tungsten film 68 and the polycrystalline silicon film 66 can be reduced.

Since, moreover, the polycrystalline silicon film 66 and the titanium nitride film 67 exist between the tantalum/tungsten film 68 and the principal face of the n-type semiconductor region 61, the invasion of the tungsten or tantalum from the tantalum/tungsten film 68 through the polycrystalline silicon film 66 can be reduced at the heat treating step after the deposition of the tantalum oxide film, thereby to reduce the dislocation at the principal face of the n-type semiconductor region 61.

Figure 13:
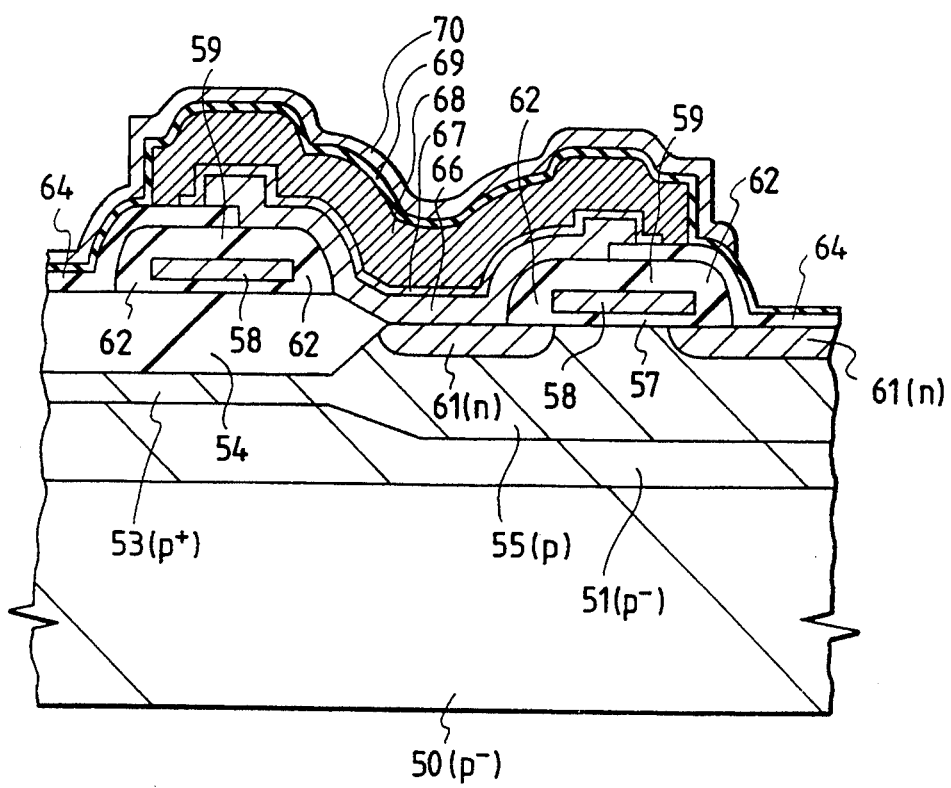
FIG. 13 is a section showing an enlarged essential portion of FIG. 7 at each step.

Next, the upper electrode 70 is formed. This upper electrode 70 is formed by depositing a tungsten film by the sputtering method, for example. This tungsten film is formed to have a thickness of about 100 nm, for example. After this, the tungsten film is patterned by the photolithography technique and the etching technique to form the upper electrode 70 of the capacitor element C, as shown in FIG. 13. This step of forming the upper electrode 70 completes the capacitor element C of stacked structure, whereupon the memory cell is completed.

Next, the inter-layer insulating film 72 is formed. This inter-layer insulating film 72 is formed by depositing a silicon oxide film by the CVD method and then a BPSG film by the CVD method. The overlying BPSG film is subjected, after its deposition, to a reflow treatment to have its surface flattened.

Next, the inter-layer insulating film 72 is formed with a connection hole. This connection hole is formed to exposed the surface of one n-type semiconductor region 61 of the selecting MISFET Qs to the outside. At this step, the charge storing insulating film 69 is removed from the connection hole forming region.

Figure 14:
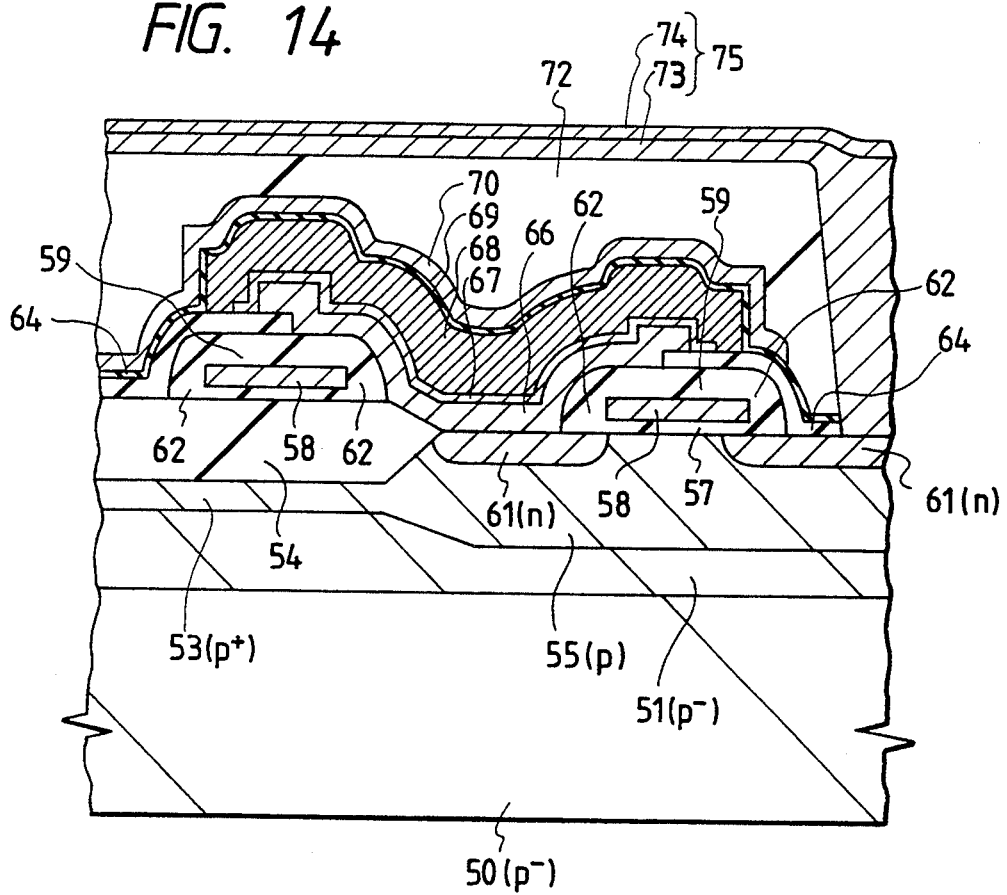
FIG. 14 is a section showing an enlarged essential portion of FIG. 7 at each step.

Next, the inter-layer insulating film 72 is formed thereover with the complementary bit line 75, as shown in FIG. 14. This complementary bit line 75 is connected with the memory cell through the connection hole of the inter-layer insulating film 72. The complementary bit line 75 is formed at the step of forming a fourth-layer gate material. The complementary bit line 75 is formed by depositing the polycrystalline silicon film 73 by the CVD method and then the tungsten film 74 by the sputtering method or the CVD method and by patterning the laminated film by the photolithography technique and the etching technique.

Next, the inter-layer insulating film 78 is formed. This inter-layer insulating film 78 is formed by depositing the silicon oxide film 76 by the CVD method and then the BPSG film 77 by the CVD method. This BPSG film 77 is subjected after its deposition to the reflow treatment.

Next, the inter-layer insulating film 78 is formed thereover with the data line 79. This data line 79 is formed at the step of forming the first-layer wiring material. The data line 79 is formed by patterning a refractory metal laminated film by the photolithography technique and the etching technique. The refractory metal laminated film is formed, for example, by depositing a tungsten film by the sputtering method and then a tungsten film by the CVD method.

Next, the inter-layer insulating film 80 is formed. This inter-layer insulating film 80 is formed of a three-layered silicon oxide film. The lower and upper silicon oxide films are formed by the plasma CVD method using a TEOS gas as its raw material, for example. The intermediate silicon oxide film is formed of an SOG film, for example.

Next, the shunting word line 84 is formed. This shunting word line 84 is formed at the step of forming a second-layer wiring material. The shunting word line 84 is formed, for example, by depositing the titanium/tungsten film 81, the aluminum alloy film 82 and the titanium/tungsten film 83 individually by the sputtering method and then by patterning the laminated film by the photolithography technology and the etching technology.

Next, the final passivation film 87 is formed to complete the semiconductor device of the present embodiment 3, as shown in FIG. 7. This final passivation film 87 is formed, for example, by depositing the silicon oxide film 85 by the plasma CVD method using the TEOS gas as its raw material, by depositing the silicon nitride film 85 by the plasma CVD method, and by applying and setting a not-shown polyimide resin film.

As has been described hereinbefore, according to the process for manufacturing the semiconductor device of the present embodiment 3, the charge storing insulating film 69 can be formed of the single-layer film of tantalum oxide, like the foregoing embodiment, to increase the dielectric constant of the charge storing insulating film. As a result, it is possible to form a dielectric film having a high dielectric constant in the semiconductor device manufacturing process. Moreover, the size of the capacitor element can be reduced to integrate the semiconductor device highly.

Like the foregoing embodiment 2, moreover, even in case the tantalum oxide film deposited by the CVD method has a dispersion in its thickness, the tantalum in the underlying tantalum/tungsten film 68 is oxidized in the thin region of the tantalum oxide film so that the tantalum oxide film separates onto the surface of the tantalum/tungsten film 68. Moreover, the tantalum oxide film to separate has its growth stopped at a constant thickness. Thus, the tantalum oxide film to be deposited on the tantalum/tungsten film 68 can be sufficiently oxidized to reduce the dispersion of the thickness of the tantalum oxide film with the tantalum oxide film having separated. As a result, breakdown voltage of the charge storing insulating film 69 can be improved to improve the reliability of the semiconductor device.

At the step of oxidizing the tantalum oxide film after the deposition, moreover, it is possible to reduce the oxidation of the polycrystalline silicon film 66 composing the lower electrode. Moreover, the reaction between the tantalum/tungsten film 68 and the polycrystalline silicon film 66 can be reduced.

Although the present embodiment 3 is exemplified by forming the oxidation resisting film of the titanium nitride film 67, the oxidation resisting film can also be formed of an alloy film of titanium and tungsten. In case the oxidation resisting film is formed of the titanium nitride 67, it is possible to reduce either the oxidation of the polycrystalline silicon film 66 or the reaction between the tantalum/tungsten film 68 and the polycrystalline silicon film 66 to a temperature of about 1,000° C. In case, on the other hand, the oxidation resisting film is formed of the alloy film of titanium and tungsten, it is possible to reduce either the oxidation of the polycrystalline silicon film 66 or the reaction between the tantalum/tungsten film 68 and the polycrystalline silicon film 66 to a temperature of about 700° C.

EMBODIMENT 4

The process for manufacturing a semiconductor device according to the embodiment 4 of the present invention is modified from the semiconductor device manufacturing process of the foregoing embodiment such that the oxidation resisting film is formed of a refractory metal silicide film. The manufacture process will be described in the following with reference to FIGS. 15 to 17 (presenting sections showing an essential portion of FIG. 7 in an enlarged scale and at each step).

First of all, as shown in FIG. 9, the process to the step of patterning the polycrystalline silicon film 66 is accomplished like the foregoing embodiment 3.

Figure 15:
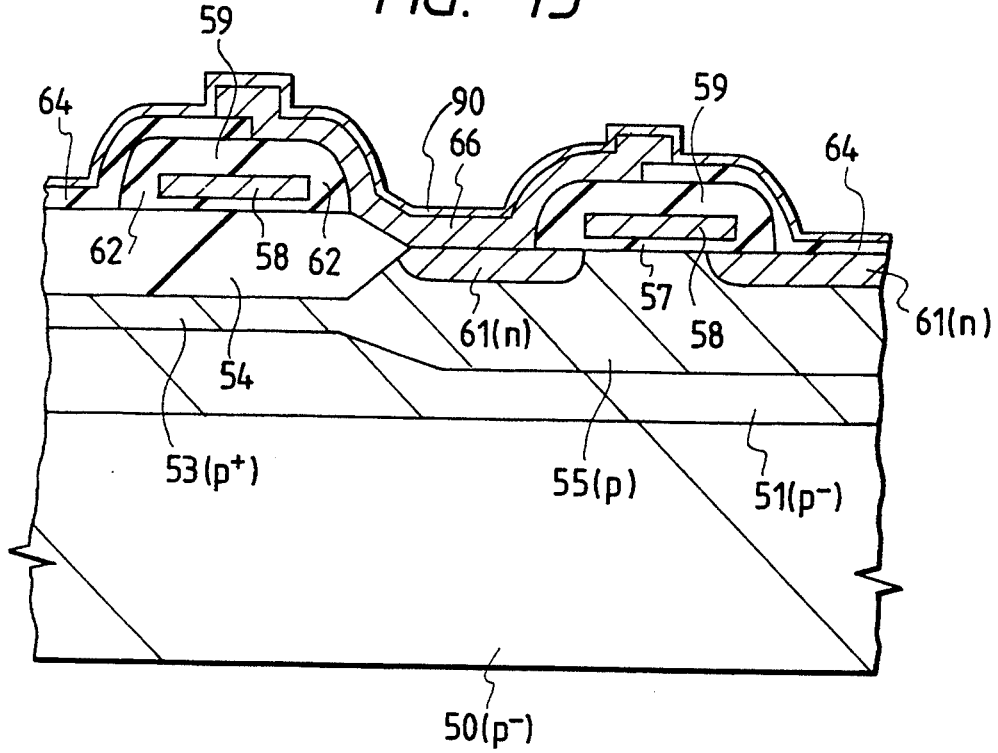
FIG. 15 is a section showing a semiconductor device according to an embodiment 4 of the present invention and an enlarged essential region corresponding to the essential portion of FIG. 7 as a portion of a step.
Figure 16:
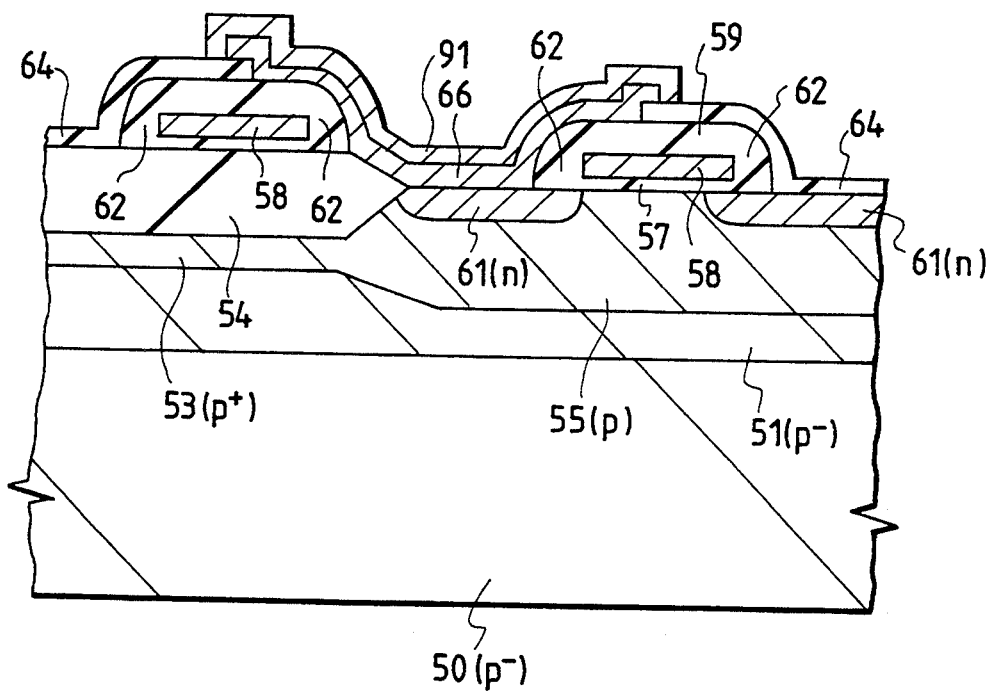
FIG. 16 is a section showing an essential portion of the region shown in FIG. 15 as a portion of a step.

Next, a refractory metal film 90 is formed, as shown in FIG. 15. This refractory metal film 90 is formed, for example, by depositing a titanium film to a thickness of about 85 nm by the sputtering method. After this, a heat treatment at about 600° C. is performed to effect a reaction (or silicification) between the refractory metal film 90 and the underlying polycrystalline silicon film 66. After this, the refractory metal film 90 left unreacted is removed to form a refractory metal silicide (e.g., titanium silicide film) 91 on the surface of the polycrystalline silicon film 66, as shown in FIG. 16. This titanium silicide film 91 is formed to have a thickness of about 200 nm in case the thickness of the titanium film 90 is about 85 nm. Thus, by forming the refractory metal silicide film 91 by silicifying the refractory metal film 90, the refractory metal silicide film 91 is formed in self-alignment with the polycrystalline silicon film 66. As a result, the planar layout area of the capacitor element C can be further reduced to integrate the semiconductor device more highly.

After this, the steps on and after the step of forming the tantalum/tungsten film 68 are performed like those of the foregoing embodiment 3 to complete the semiconductor device of the present embodiment 4.

Incidentally, the present embodiment 4 is exemplified by forming the oxidation resisting film of the titanium silicide film, but the oxidation resisting film can also be formed of a nickel silicide film or a cobalt silicide film, for example. In order to form the refractory metal silicide film having a thickness of about 200 nm, the nickel film may be formed to have a thickness of about 114 nm, and the cobalt film may be formed to have a thickness of about 56 nm.

EMBODIMENT 5

Next, the structure of a semiconductor device according to the embodiment 5 of the present invention will be described with reference to FIG. 17 (presenting a section showing an essential portion). Incidentally, FIG. 17 omits presentation of a peripheral circuit, which will not be described.

Figure 17:
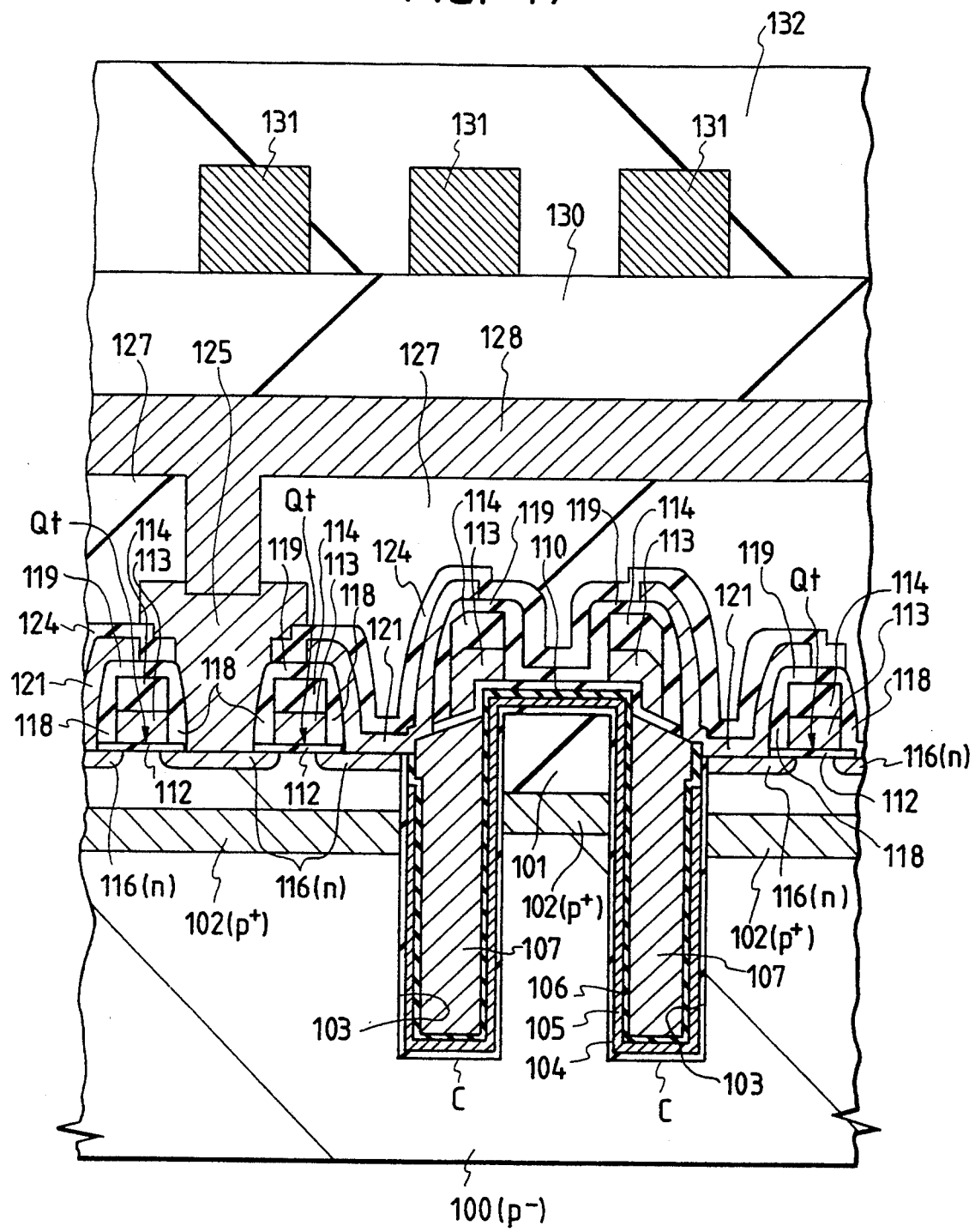
FIG. 17 is a section showing an essential portion of a semiconductor device according to an embodiment 5 of the present invention.

As shown in FIG. 17, a semiconductor device according to the present embodiment 5 is a DRAM which has a memory cell composed of a capacitor element C of stacked structure formed in a groove (or trench) and a selecting MISFET Qs connected in series.

The semiconductor device is constructed of a p⁻-type semiconductor substrate 100. This p⁻-type semiconductor substrate 100 is made of single-crystal silicon, for example.

The selecting MISFET Qs is composed mainly of a gate insulating film 112, a gate electrode 113 formed over the gate insulating film 112, and n-type semiconductor regions 116 constituting the source region and the drain region.

The gate insulating film 112 is formed over the principal face of the p⁻-type semiconductor substrate 100. This gate insulating film 112 is formed of a silicon oxide film, for example.

The gate electrode 113 is formed of a polycrystalline silicon film, for example. This gate electrode 113 is made integral with the word line 113. This gate electrode 113 is formed thereover with an insulating film 114. This insulating film 114 is formed, for example, of a silicon oxide film which is deposited by the CVD method. On the other hand, the gate electrode 113 is sided by a side wall spacer 118. This side wall spacer 118 is formed, for example of a silicon oxide film which is deposited by the CVD method.

The n-type semiconductor region 116 is formed in the principal face of the p⁻-type semiconductor substrate 100 and in self-alignment with the gate electrode 113. This n-type semiconductor region 116 is given the function either the source region or drain region of the selecting MISFET Qs. This n-type semiconductor region 116 is connected at one hand with a data line 128 through a second connecting electrode 125.

The capacitor element C is formed in the groove 100 formed in the p⁻-type semiconductor substrate 100. This capacitor element C is composed mainly of a plate electrode 105 and a node electrode 107 formed over the plate electrode 105 through the charge storing insulating film 106.

The plate electrode 105 is formed in the thin hole 103 through an insulating film 104. This plate electrode 105 is formed, for example, of a tungsten film (i.e., a tantalum/tungsten film) containing tantalum. This tantalum/tungsten film contains about 50 atm % of tantalum. This tantalum/tungsten film has a thickness of about 100 nm, for example. The insulating film 104 is formed of a silicon oxide film, for example. This silicon oxide film has a thickness of about 40 to 60 nm, for example.

The charge storing insulating film 106 is formed of a tantalum oxide film, for example. The dielectric constant of the tantalum oxide film is about six times as high as that of the silicon oxide film and higher than that of the silicon oxide film, the silicon nitride film or their laminated film. The tantalum oxide film has a thickness of about 18 to 24 nm or less, for example. Thus, the size of the capacitor element C for retaining the same amount of charge to be stored can be reduced to integrate the semiconductor device highly.

The node electrode 107 is formed of a tungsten film, for example. This tungsten film has such a thickness as to bury the groove 103. The tungsten film is formed of a laminated film which is composed of a tungsten film deposited by the sputtering method and a tungsten film deposited by the CVD method. These tungsten films deposited by the sputtering method and the CVD method are individually given a thickness of about 200 nm, for example. The node electrode 107 is connected with either of the source region or the drain region of the selecting MISFET Qs through a first connecting electrode 121. This first connecting electrode 121 is formed of a polycrystalline silicon film, for example.

The groove 103 of the capacitor element C has a rectangular section. Moreover, the surface of the p⁻-type semiconductor substrate 100 at positions corresponding to the side wall and bottom of the groove 103 is not used as the electrode of the capacitor element C.

Thus, in the memory cell of the present embodiment 4, the surface of the p⁻-type semiconductor substrate 100 of the thin hole 103 is not used as the capacitor electrode so that the memory cell is strong against the soft errors due to alpha rays and can prevent the leakage current between the capacitor elements C to realize a DRAM of low power consumption.

In the lower portion of the memory cell, moreover, the p⁻-type semiconductor substrate 100 is formed therein with a p⁻-type semiconductor region 102 having a higher impurity concentration than that of the p⁻-type semiconductor substrate 100. The p⁺-type semiconductor region 102 is formed in contact with an inter-element isolating insulating film 101 around the memory cell.

The first connecting electrode 121 is formed through the side wall spacer 118 in self-alignment with the gate electrode (or word line). Moreover, this first connecting electrode 121 is connected with the n-type semiconductor region 116 and the node electrode 107 through the opening of an inter-layer insulating film 119. This inter-layer insulating film 119 is formed of a silicon oxide film, for example.

The second connecting electrode 125 is formed through the side wall spacer 118 in self-alignment with the gate electrode (or word line) 113. This second connecting electrode 125 is formed of a polycrystalline silicon film, for example. This second connecting electrode 125 is connected with the n-type semiconductor region 116 through an opening of an inter-layer insulating film 124. This inter-layer insulating film 124 is formed of a silicon oxide film, for example.

The data line 128 is formed of a tungsten film, for example. This data line 128 is connected with the second connecting electrode 125 through a first inter-layer insulating film 127. This first inter-layer insulating film 127 is formed, for example, of a laminated film of a silicon oxide film and a BPSG film.

On the other hand, the data line 128 is overlain by the second inter-layer insulating film and a wiring line acting as a column select signal line. The second inter-layer insulating film is formed of a three-layered silicon oxide film, for example. The upper and lower silicon oxide films are formed, for example, by the plasma CVD method using the TEOS gas as its source gas. The intermediate silicon oxide film is formed of the SOG film. The wiring line is formed, for example, of a tungsten film or an aluminum alloy film having silicon and copper added thereto. The tungsten film is formed, for example, of a laminated film which is composed of a tungsten film deposited by the sputtering method and a tungsten film deposited by the CVD method.

The not-shown wiring line is overlain by a third inter-layer insulating film 130. This third inter-layer insulating film 130 is formed of a three-layered silicon oxide film, for example. The upper and lower silicon oxide films are formed, for example, by the plasma CVD method using the TEOS gas as its source gas. The intermediate silicon oxide film is formed of the SOG film.

The third inter-layer insulating film 130 is formed thereover with a shunting word line (WL) 131. This shunting word line 131 is formed, for example, of either an aluminum alloy film or a laminated film composed mainly of an aluminum alloy film. The shunting word line 131 is connected at the end portions of the memory mat with the word line 113.

The shunting word line 131 is formed thereover with a surface passivation film 132. This surface passivation film 132 is formed, for example, of a laminated film which is composed of a PSG film, a silicon nitride film deposited by the plasma CVD method, and a resin film of polyimide.

Next, the process for manufacturing a semiconductor device according to the embodiment 5 will be described with reference to FIGS. 18 to 25 (presenting sections showing an essential portion of the region shown in FIG. 17 at individual steps). Incidentally, any peripheral circuit is neither shown nor described.

First of all, there is prepared the p$^-$-type semiconductor substrate 100 of single-crystal silicon. After this, the p$^-$-type semiconductor substrate 100 has its principal face thermally oxidized in a selective manner to form the inter-element isolating insulating film 101.

Next, the p$^-$-type semiconductor substrate 100 is implanted with the ions of B through the inter-element isolating insulating film 101 to form the p$^+$-type semiconductor region 102. This p$^+$-type semiconductor region 102 is formed in a deeper position than the region of the inter-element isolating insulating film 101 in the region having no inter-element isolating insulating film 101.

Next, by using the silicon nitride film formed with an opening in a position formed with the thin hole 103, the silicon nitride film or the resist film for patterning the silicon nitride film as a mask, the p$^-$-type semiconductor substrate 100 is etched to form the groove 103. This thin hole 103 is formed to have a depth of 3 to 5 $\mu$m from the surface. This groove 103 is formed to remove the end portions of the inter-element isolating insulating film 101 and the bird's beak portion of the inter-element isolating insulating film. The groove 103 is formed by the dry etching technique and has a side generally normal to the principal face of the p$^-$-type semiconductor substrate 100.

Next, the silicon nitride film is removed to form the insulating film 104. This insulating film 104 is formed, for example, by depositing the silicon oxide film having a thickness of about 50 nm by the CVD method.

Figure 18:
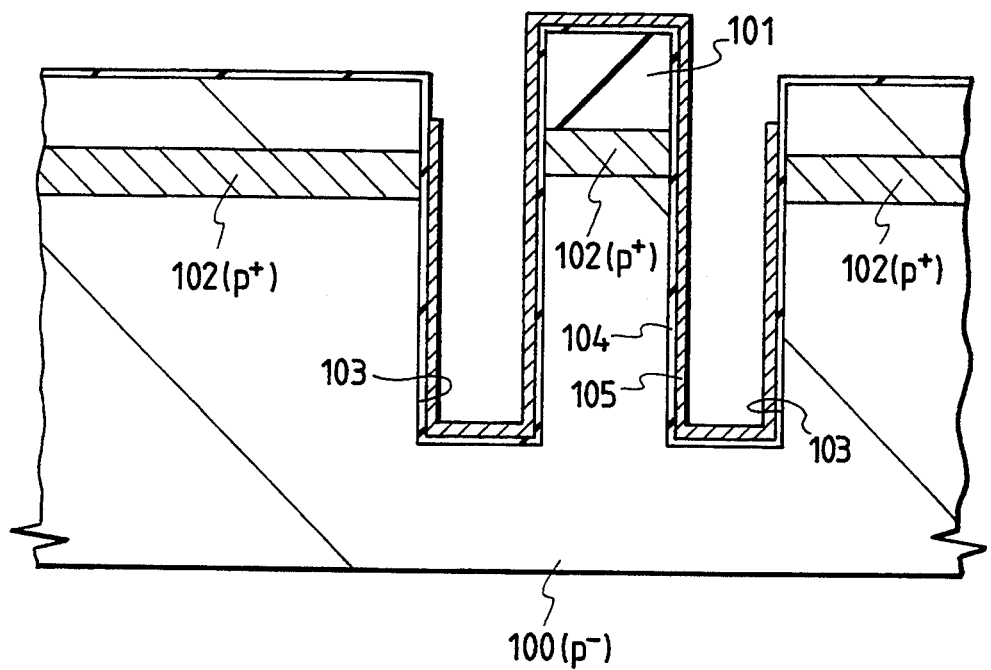
FIG. 18 is a section showing an essential portion of the region shown in FIG. 17 at each step.

Next, there is formed a tungsten film (i.e., a tantalum/tungsten film) containing tantalum for forming the first electrode, i.e., plate electrode 105 of the capacity element C. This tantalum/tungsten film contains about 50 atom % of tantalum. The tantalum/tungsten film is formed, for example, by the sputtering method using an alloy target. This tantalum/tungsten film is formed to have a thickness of about 100 nm, for example. After this, the tantalum/tungsten film is patterned by the photolithography technique and the etching technique to form the plate electrode 105, as shown in FIG. 18.

Figure 19:
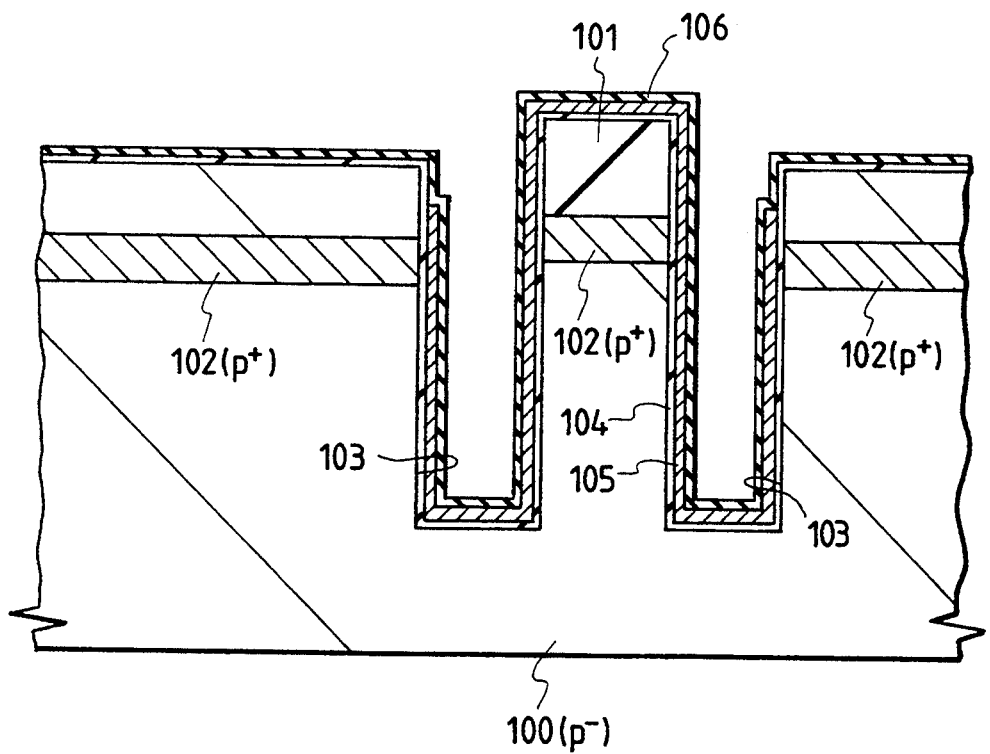
FIG. 19 is a section showing an essential portion of the region shown in FIG. 17 at each step.

Next, as shown in FIG. 19, a tantalum oxide film for a charge storing insulating film 106 of the capacitor element C is formed to have a thickness of about 18 to 24 nm or less. This tantalum oxide film is formed, for example, by bubbling pentaethoxytantalum while exemplifying the carrier gas by about 500 sccm of oxygen and about 500 sccm of nitrogen at a temperature of about 420° C. and under a pressure of about 49.99 Pa.

Next, a heat treatment is performed at a temperature of about 700° C. for about 30 minutes. The atmosphere for this heat treatment is a mixture gas of about 30% of steam and hydrogen under 1 Pa. The partial pressure in this instance may be so set as is shown in FIG. 5 of the foregoing embodiment 1. Thanks to this heat treatment, even in case the tantalum oxide film has dispersion in its thickness, the tantalum in the underlying tantalum/tungsten film is oxidized in the thin region (or weak spot) of the tantalum oxide film, so that the tantalum oxide film separates onto the tantalum/tungsten film. The tantalum oxide film in the thin region is thickened with the tantalum oxide film formed by that heat treatment. Moreover, the tantalum oxide film to separate onto the surface of the tantalum/tungsten film has its growth stopped at a constant thickness. Thus, the tantalum oxide film formed over the tantalum/tungsten film can be sufficiently oxidized to reduce the dispersion of the thickness of the tantalum oxide film. As a result, it is possible to improve the breakdown voltage of the charge storing insulating film 106.

Figure 20:
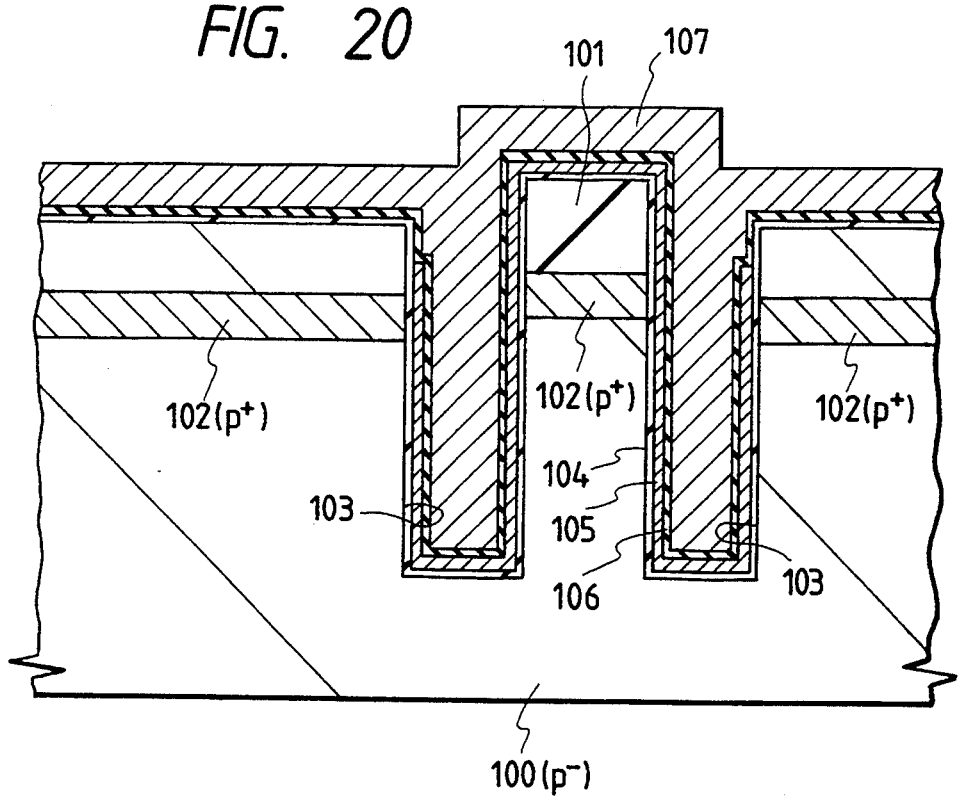
FIG. 20 is a section showing an essential portion of the region shown in FIG. 17 at each step.

Next, as shown in FIG. 20, a tungsten film for the second electrode of the capacitor element C, i.e., the node electrode 107 is formed to have a thickness of about 400 nm. At this time, the groove 103 is buried with that tungsten film. This tungsten film is formed, for example, by depositing a tungsten film of about 200 nm by the sputtering method and then by depositing a tungsten film of about 200 nm by the CVD method.

Figure 21:
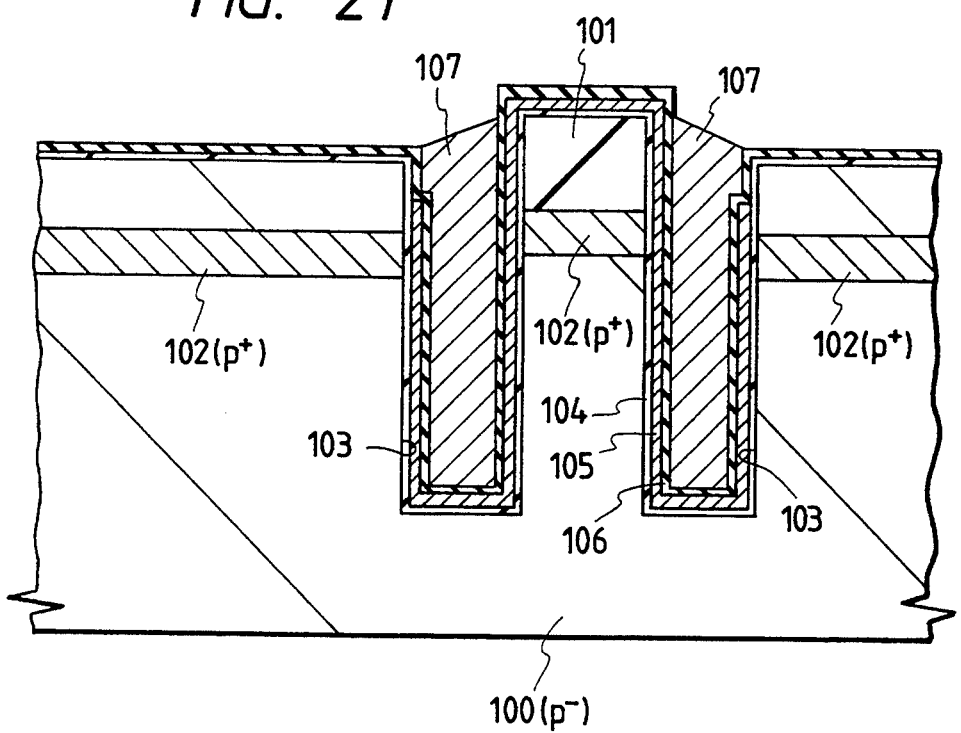
FIG. 21 is a section showing an essential portion of the region shown in FIG. 17 at each step.

Next, the tungsten film 107 is patterned by the photolithography technique and the etching technique to have its surface generally leveled with that of the p$^-$-type semiconductor substrate 100, as shown in FIG. 21. At this step, the capacitor element C is completed.

Figure 22:
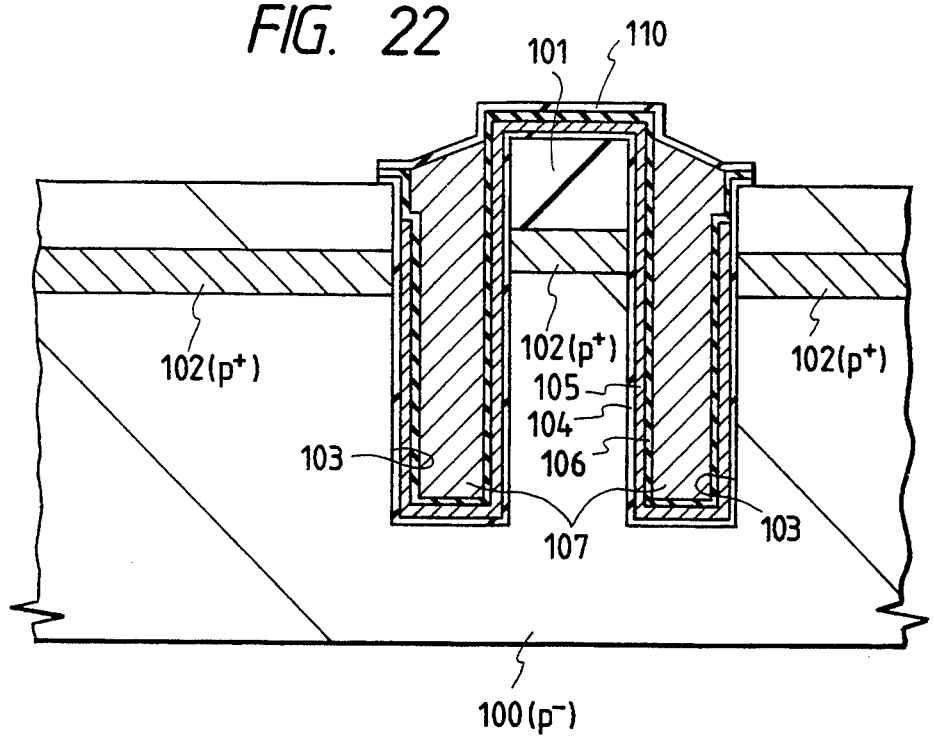
FIG. 22 is a section showing an essential portion of the region shown in FIG. 17 at each step.

Next, an insulating film 110 such as a silicon oxide film is deposited by the CVD method. After this, the insulating film 110 is patterned by the photolithography technology and the etching technology into a pattern covering the groove 103, as shown in FIG. 22. The insulating film 110 is formed to insulate the node electrode 107 from the word line 113 formed over the node electrode 107. When the insulating film 110 is patterned, the silicon oxide film 104 and the tantalum oxide film 105 of the principal face of the p$^-$-type semiconductor substrate 100 are removed in the regions other than that formed with the groove 103.

Next, the p$^-$-type semiconductor substrate 100 has its surface thermally oxidized to form a silicon oxide film for the gate insulating film 112. After this, a third-layer polycrystalline silicon film for the gate electrode 113 and the word line 113 is deposited, on which a silicon oxide film for the insulating film 114 is further deposited. Moreover, these two films are patterned for the word line 113 by the photolithography technique and the etching technique.

Figure 23:
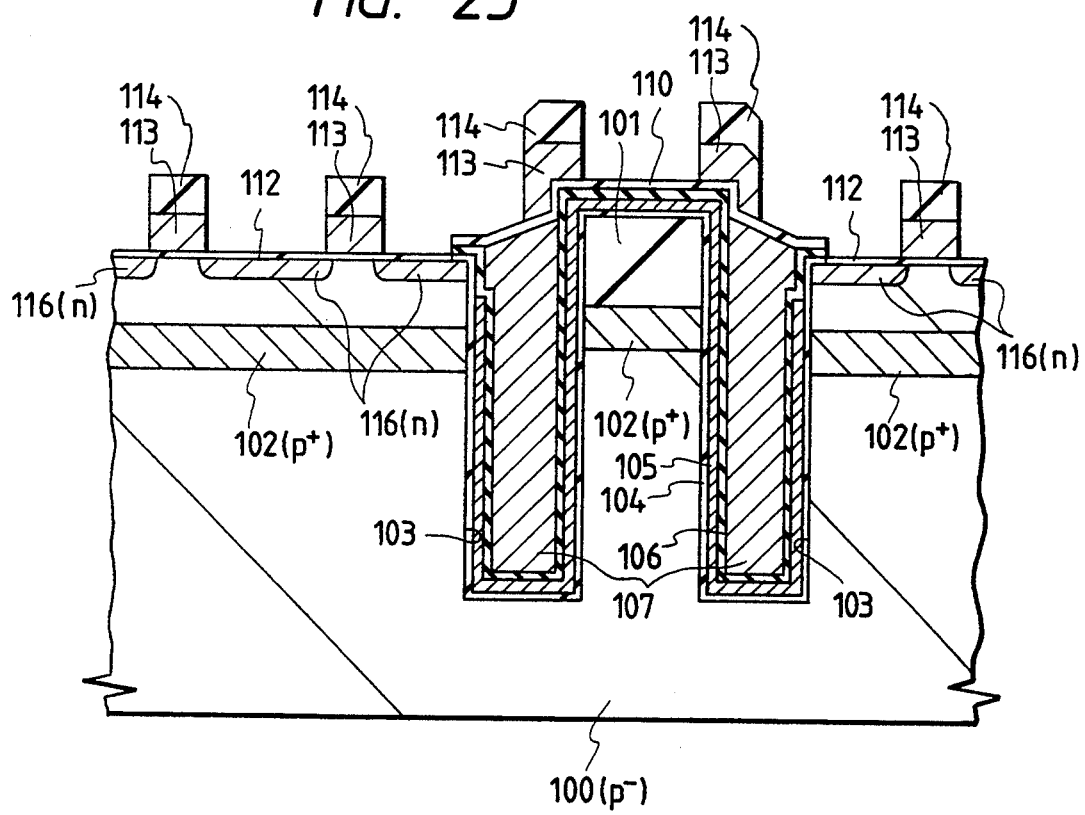
FIG. 23 is a section showing an essential portion of the region shown in FIG. 17 at each step.

Next, the ions of phosphorus or arsenic are introduced to form the n-type semiconductor region 116 in self-alignment with the gate electrode (or word line) 113, as shown in FIG. 23.

Figure 24:
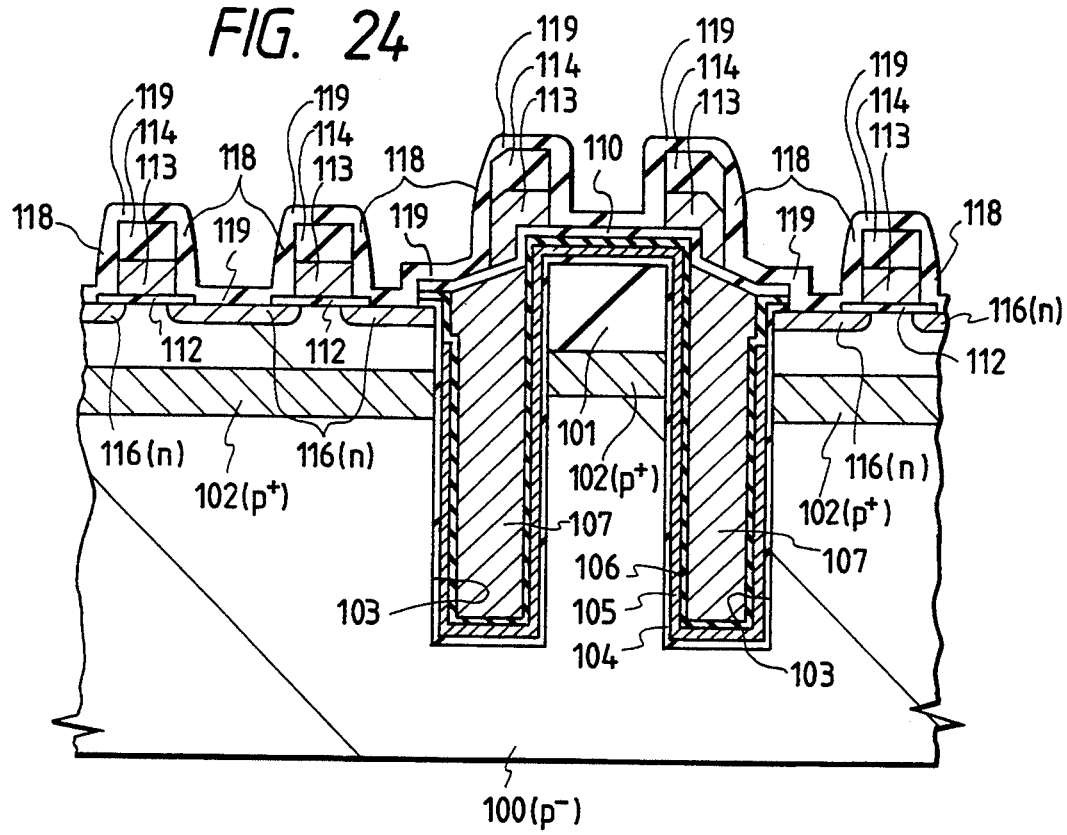
FIG. 24 is a section showing an essential portion of the region shown in FIG. 17 at each step.

Next, an insulating film such as a silicon oxide film is deposited by the CVD method, and then anisotropic etching corresponding to the deposited film thickness is performed to form the side wall spacer 118 on the side wall of the gate electrode (or word line) 113. After this, as shown in FIG. 24, the inter-layer insulating film 119 is formed. This inter-layer insulating film 119 is formed, for example, by depositing a silicon oxide film by the CVD method.

Next, the inter-layer insulating film 119 is formed with an opening for connecting the node electrode 107 of the capacity element C and the source region or drain region of a selecting MISFET Qt. After this, the polycrystalline silicon film is deposited by the CVD method, for example.

Next, the polycrystalline silicon film is patterned by the photolithography technology and the etching technology to form the first connecting electrode 121 for connecting the node electrode 107 of the capacitor element C and the source region or drain region of the selecting MISFET Qt. The first connecting electrode 121 is formed in self-alignment with the gate electrode 113 and the word line 113.

Next, the silicon oxide film is deposited by the CVD method, for example, to form the inter-layer insulating film 124. After this, this inter-layer insulating film 124 is formed with an opening for exposing to the outside the surface of the n-type semiconductor region 116 at the side to be connected with the data line 128.

Figure 25:
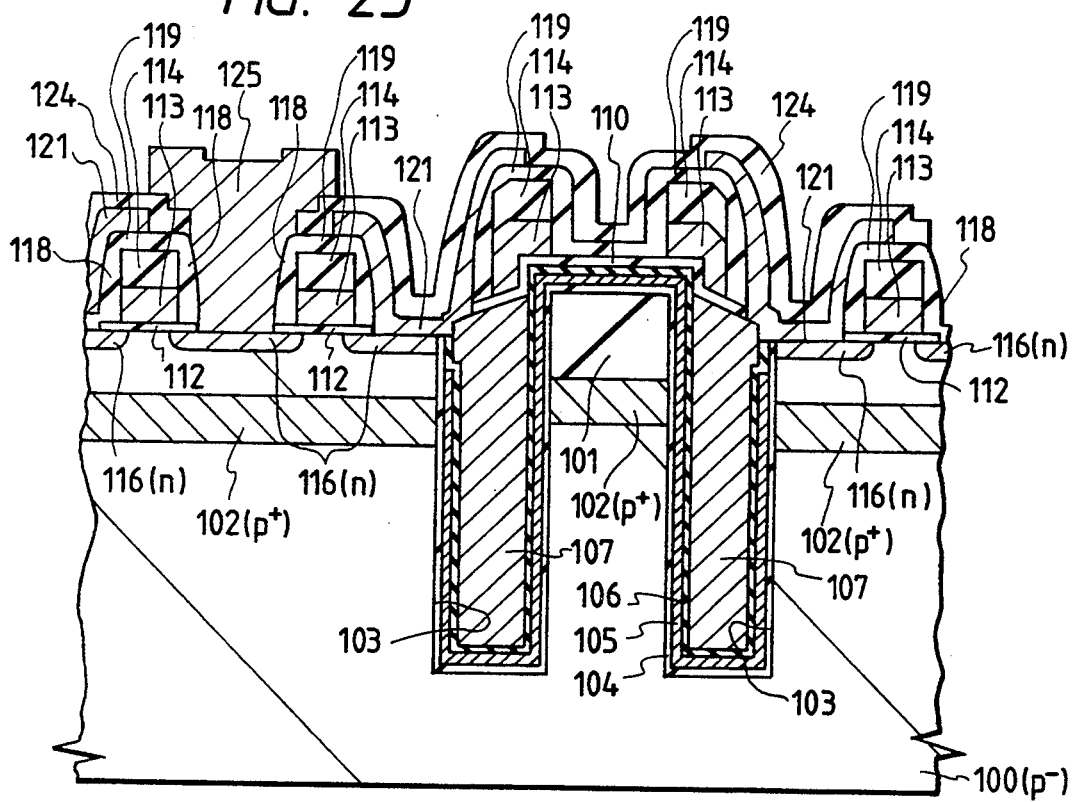
FIG. 25 is a section showing an essential portion of the region shown in FIG. 17 at each step.

Next, the polycrystalline silicon film is deposited by the CVD method, for example. After this, the polycrystalline silicon film is patterned by the photolithography technique and the etching technique to form the second connecting electrode 125, as shown in FIG. 25. This second connecting electrode 125 is formed in self-alignment with both of the gate electrode 113 and the word line 113.

Next, the first inter-layer insulating film 127 is formed. This first inter-layer insulating film 127 is formed, for example, by depositing a silicon oxide film and a BPSG film sequentially by the CVD method. This BPSG film is subjected after its deposition to a reflow treatment to have its surface flattened.

Next, the first inter-layer insulating film 127 is formed with an opening. This opening is provided for connecting the data line 128 with the selecting MISFET Qt. The opening exposes the surface of the second connecting electrode 125 to the outside.

Next, the first wiring for the data line 128 is formed. This first wiring is formed of either a tungsten film or an aluminum alloy film containing silicon and copper. In case of the tungsten film, the first wiring line is formed of a laminated film which is composed of a tungsten film formed by the sputtering method and a tungsten film formed by the CVD method.

Next, the not-shown second inter-layer insulating film is formed. This second inter-layer insulating film is formed of a three-layered silicon oxide film. The lower and upper silicon oxide films are formed by the plasma CVD method using the TEOS gas as its source gas. The intermediate silicon oxide film is formed of the SOG film.

Next, the not-shown second inter-layer insulating film is formed with an opening, and the not-shown wiring line for a column select signal line (YSL) is then formed. This second wiring line is formed of either a tungsten film or an aluminum alloy film containing silicon and copper. In case of the tungsten film, the second wiring line is formed of a laminated film which is composed of a tungsten film formed by the sputtering method and a tungsten film formed by the CVD method.

Next, the third inter-layer insulating film 130 is formed. This third inter-layer insulating film 130 is formed of a three-layered silicon oxide films. The lower and upper silicon oxide films are individually formed by the plasma CVD method using the TEOS gas as its source gas. The intermediate silicon oxide film is formed of the SOG film.

Next, the third inter-layer insulating film 130 is formed with a not-shown opening, and then the third wiring line 131 for the shunting word line 131 is formed. This third wiring line 131 is formed of either an aluminum alloy film containing silicon and copper or a tungsten film. In case the tungsten film is used, the third wiring line 131 is formed, for example, of a laminated film which is composed of a tungsten film formed by the sputtering method and a tungsten film formed by the CVD method.

Next, the surface passivation film 132 is formed. This surface passivation film 132 is formed, for example, of a laminated film which is composed of a silicon nitride film formed by a PSG film, the plasma CVD method and a polyimide resin film. After the steps thus far described, the semiconductor device according to the present embodiment 5 is completed, as shown in FIG. 17.

As has been described hereinbefore, the present embodiment 5 comprises: a step of forming the plate electrode 105 of a tantalum/tungsten film; a step of forming the charge storing insulating film 106 by depositing a tantalum oxide film over the tantalum/tungsten film 105; a step of oxidizing the tantalum oxide film; and a step of forming the second electrode 107 over the tantalum oxide film. According to this structure, the charge storing insulating film 106 is formed of a single-layer film of the tantalum oxide film like the foregoing embodiment 1. As a result, a dielectric film having a high dielectric constant can be formed in the semiconductor device manufacturing process. Since, moreover, the amount of charge to be stored per unit area can be increased, the planar layout area of the capacitor element C can be reduced to increase the degree of integration of the semiconductor device.

After the tantalum oxide film has been deposited by the CVD method, the tantalum in the underlying tantalum/tungsten film of the tantalum oxide film is selectively oxidized in the thin region (i.e., weak spot) of the tantalum oxide film, so that the tantalum oxide film separates onto the surface of the tantalum/tungsten film. By the tantalum oxide formed at that oxidation step, the thickness of the tantalum oxide film formed by the CVD method is increased in the thin region. Moreover, the tantalum oxide film having separated onto the surface of the tantalum/tungsten film has its growth stopped at a constant thickness. Thus, it is possible to reduce the dispersion of the thickness of the tantalum oxide film formed over the tantalum/tungsten film. As a result, the breakdown voltage of the charge storing insulating film 106 can be improved to improve the reliability of the capacitor element C.

Since, moreover, the capacitor element C of the stacked structure is formed in the groove 103 to have its plate electrode 105 positioned at the lower-most layer, the plate electrode 105 can be formed of a single-layer film of the tantalum/tungsten film. Thus, the number of steps can be reduced to an extent corresponding to the step of forming the oxidation resisting film.

Although the present invention has been specifically described in connection with the embodiments thereof, it should not be limited to the foregoing embodiments but can naturally be modified in various manners without departing from the gist thereof.

For example, the foregoing embodiments 1 to 5 are exemplified by the semiconductor device having memory cells of DRAM, but the present invention can be applied to semiconductor devices having other capacitor elements.

In the foregoing embodiments 2 to 5, moreover, the tantalum film is formed over the tantalum/tungsten film by the sputtering method, for example, and can be oxidized to form the tantalum oxide film.

Moreover, the tantalum/tungsten film can be replaced by a laminated film having a tungsten film laminated over a lower tungsten film, and the laminated film can then be formed thereover with a tantalum oxide film by the sputtering method, for example, to oxidize the tantalum oxide film.

Moreover, the foregoing embodiments 1 to 4 are exemplified by forming the lower electrode of the laminated film which is composed of of the polycrystalline silicon film and the tantalum/tungsten film, but the present invention can have its lower electrode composed of a single-layer tantalum/tungsten film.

Moreover, the foregoing embodiments 1 to 5 are exemplified by forming the charge storing insulating film of the tantalum oxide film, but the present invention can also have its charge storing insulating film 14 formed of a metal oxide film which is composed of an element of IVb group or Vb group or a combination of two more kinds. These metal oxide films have higher dielectric constants than that of the single-layer film of a silicon oxide film or a laminated film of a silicon oxide film and a silicon nitride film, so that the amount of charge to be stored per unit area is increased. Thus, the size of the capacitor element C can be reduced to increase the degree of integration of the semiconductor device.

Moreover, the foregoing embodiments 1 to 5 are exemplified by making the tantalum (or any metal belonging to the IVb or Vb group) containing alloy of tungsten or molybdenum, but the metal film of molybdenum and tungsten can contain tantalum in accordance with the present invention.

In the foregoing embodiments 3 to 5, moreover, the tantalum/tungsten film can be replaced by another metal film. Furthermore, the method of forming the tantalum oxide film can be exemplified by that of the embodiment 1.

As the atmosphere for oxidizing the metal film composed of two kinds of metals selectively, moreover, according to the present invention, the alloy film can also be selectively oxidized (in a dry state) by using an atmosphere for oxidizing a first one of the two metals composing the metal film and reducing the second metal, e.g., a mixture gas of carbon dioxide and carbon monoxide. Under the condition in which the oxidizing rate depending upon the kind of metal is low, the atmosphere can also be exemplified by a mixture gas containing either oxygen or oxygen and an inert gas. Furthermore, only the second metal can be reduced by an annealing with hydrogen after the metal oxide film deposited on the metal film composed of two kinds of metals has been oxidized.

The effects obtainable from the representative of the invention disclosed herein will be briefly described in the following.

A high integration can be attained in the process for manufacturing a semiconductor device having a capacity element. The reliability can be improved in the process for manufacturing the semiconductor device. A dielectric film having a high dielectric constant can be formed in the process for manufacturing the semiconductor device.

What is claimed is:

1. A process for manufacturing a semiconductor device, comprising:
    (a) a step of forming a first electrode comprised of a first film of a mixture of first and second metals over a semiconductor substrate;
    (b) a step of depositing a dielectric film made of an oxide film of said first metal on said first electrode;
    (c) a step of oxidizing said first electrode and said dielectric film in an oxidizing atmosphere such that said first metal is oxidized and said second metal is not oxidized; and
    (d) a step of forming a second electrode over said dielectric film.

2. A process for manufacturing a semiconductor device according to claim 1, wherein said first metal is an element belonging to the IVb or Vb group whereas said second metal is at least one metal selected from the group consisting of Mo and W.

3. A process for manufacturing a semiconductor device according to claim 2, wherein said oxidation is performed in an atmosphere containing $H_2O$ and $H_2$.

4. A process for manufacturing a semiconductor device according to claim 3, wherein said first metal is Ta whereas said second metal is W.

5. A process for manufacturing a semiconductor device according to claim 4, wherein the content of said first metal is 50 atom %.

6. A process for manufacturing a semiconductor device according to claim 3, wherein said first metal is Ta whereas said second metal is Mo.

7. A process for manufacturing a semiconductor device, comprising:
    (a) a step of forming a first electrode comprised of a first film of a mixture of first and second metals over a semiconductor substrate;
    (b) a step of forming a dielectric film of an oxide film of said first metal by oxidizing said first electrode in such an atmosphere, containing $H_2O$ and $H_2$, such that said first metal is oxidized and said second metal is not oxidized; and
    (c) a step of forming a second electrode over said dielectric film.

8. A process for manufacturing a semiconductor device according to claim 7, wherein said first metal is an element belonging to the IVb or Vb group whereas said second metal is at least one metal selected from the group consisting of Mo and W.

9. A process for manufacturing a semiconductor device according to claim, 8 wherein said first metal is Ta whereas said second metal is W.

10. A process for manufacturing a semiconductor device according to claim 8, wherein said first metal is Ta whereas said second metal is Mo.

11. A process for manufacturing a semiconductor device, comprising:
    (a) a step of forming a MISFET having a source, a drain and a gate electrode over the surface of a semiconductor substrate;
    (b) a step of forming a first electrode connected electrically with one of the source and drain of said MISFET and including a first film of a mixture of a first metal and a second metal;
    (c) a step of depositing a dielectric film formed of an oxide film of said first metal over said first electrode;

(d) a step of oxidizing said first electrode and said dielectric film in an atmosphere such that said first metal is oxidized and said second metal is not oxidized; and (e) a step of forming a second electrode over said dielectric film.

12. A process for manufacturing a semiconductor device according to claim 11, wherein said first metal is an element belonging to the IVb or Vb group whereas said second metal is at least one metal selected from the group consisting of Mo and W.

13. A process for manufacturing a semiconductor device according to claim 12, wherein the oxidation is performed in an atmosphere containing $H_2O$ and $H_2$.

14. A process for manufacturing a semiconductor device according to claim 13, wherein said first metal is Ta whereas said second metal is W.

15. A process for manufacturing a semiconductor device according to claim 14, wherein the content of said first metal is 50 atom %.

16. A process for manufacturing a semiconductor device according to claim 13, wherein said first metal is Ta whereas said second metal is Mo.

17. A process for manufacturing a semiconductor device according to claim 13, further comprising a step of forming an underlying film of silicon between said first electrode and one of said source and said drain.

18. A process for manufacturing a semiconductor device according to claim 17, further comprising a step of forming a barrier layer of an oxidation resisting conductive film between said underlaying film and said first electrode.

19. A process for manufacturing a semiconductor device according to claim 18, wherein said barrier layer is made of any selected from the group consisting of TiN, a Ti-W alloy, $TiSi_2$, NiSi and $CoSi_2$.

20. A process for manufacturing a semiconductor device according to claim 1, wherein the first and second metals respectively are metals that can be oxidized under different oxidizing conditions.

21. A process for manufacturing a semiconductor device according to claim 1, comprising the further step of forming a polycrystalline silicon film between the semiconductor substrate and said first film, said first electrode including said polycrystalline silicon film.

22. A process for manufacturing a semiconductor device according to claim 21, further comprising the step of forming a barrier layer between the polycrystalline silicon film and the first film, so as to reduce oxidation of the polycrystalline silicon film.

23. A process for manufacturing a semiconductor device according to claim 21, including the further step of forming a refractory metal silicide film on the polycrystalline silicon film.

24. A process for manufacturing a semiconductor device according to claim 23, wherein the further step of forming a refractory metal silicide film includes substeps of forming a refractory metal film on the polycrystalline silicon film and silicifying the refractory metal film to form the refractory metal silicide film, whereby the refractory metal silicide film is formed in self-alignment with the polycrystalline silicon film.

25. A process for manufacturing a semiconductor device according to claim 24, wherein the refractory metal film is made of a metal selected from the group consisting of titanium, nickel and cobalt.

26. A process for manufacturing a semiconductor device according to claim 1, wherein the semiconductor substrate has a groove therein, an inner surface of the semiconductor substrate forming surfaces of the groove, and the first electrode comprised of the first film is formed over said inner surface.

27. A process for manufacturing a semiconductor device according to claim 11, wherein said first electrode is formed to overlap said gate electrode.

28. A process for manufacturing a semiconductor device according to claim 7, wherein said semiconductor substrate has a groove therein, an inner surface of the semiconductor substrate forming surfaces of the groove, and the first electrode is formed overlying said inner surface.

29. A process for manufacturing a semiconductor device according to claim 11, wherein said first electrode, dielectric film and second electrode form a capacitor element of the semiconductor device.

* * * * *